(12) United States Patent
Deng et al.

(10) Patent No.: US 7,492,798 B2
(45) Date of Patent: Feb. 17, 2009

(54) MODULAR TRANSISTOR OUTLINE CAN WITH INTERNAL COMPONENTS

(75) Inventors: Hongyu Deng, Saratoga, CA (US); Darin J. Douma, Monrovia, CA (US); Lewis B. Aronson, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/456,848

(22) Filed: Jul. 11, 2006

(65) Prior Publication Data

US 2007/0159773 A1 Jul. 12, 2007

Related U.S. Application Data

(60) Provisional application No. 60/751,880, filed on Dec. 20, 2005.

(51) Int. Cl.
*H01S 3/00* (2006.01)

(52) U.S. Cl. .............................. 372/38.01; 372/29.015; 372/38.05

(58) Field of Classification Search ................ 372/50.1, 372/38.01
See application file for complete search history.

(56) References Cited

U.S. PATENT DOCUMENTS

| | | | |
|---|---|---|---|
| 5,052,808 A | 10/1991 | Hilby et al. | |
| 6,590,706 B1 | 7/2003 | Xie et al. | |
| 6,868,104 B2 | 3/2005 | Stewart et al. | |
| 6,873,800 B1 | 3/2005 | Wei et al. | |
| 6,940,885 B1 * | 9/2005 | Cheng et al. | 372/50.1 |
| 2002/0118904 A1 * | 8/2002 | Man et al. | 385/11 |
| 2003/0152390 A1 | 8/2003 | Stewart et al. | |
| 2005/0105911 A1 * | 5/2005 | Keh et al. | 398/138 |
| 2005/0185900 A1 | 8/2005 | Farr | |
| 2005/0249450 A1 | 11/2005 | Schrodinger | |
| 2006/0022213 A1 * | 2/2006 | Posamentier | 257/99 |

OTHER PUBLICATIONS

U.S. App. No. 10/832,699, Hu et al., Packaging Assembly for Optical Subassembly.
Agilent Technologies, et al., Small Form-factor Pluggable (SFP) Transceiver MultiSource Agreement (MSA), Cooperation Agreement for Small Form-Factor Pluggable Transceivers, Sep. 14, 2000.
Lee W. Young, Written Opinion of the International Searching Authority, Apr. 2, 2008, US Document Not Provided.

* cited by examiner

*Primary Examiner*—Dung T Nguyen
(74) *Attorney, Agent, or Firm*—Workman Nydegger

(57) ABSTRACT

In one example configuration, an optical package includes a substrate that supports a laser. The laser is configured for electrical communication with circuitry disposed on the substrate, and the laser is arranged to emit an optical signal along a first path. The optical package also includes a beam steering device supported by the substrate and arranged so as to receive the optical signal from the laser along the first path. The beam steering device is configured such that the optical signal is output from the beam steering device along a second path. A group of electronic leads is provided that electronically communicates with the circuitry on the substrate. In this example, the group includes a set of modulation leads in electrical communication with the laser, and a set of bias leads in electrical communication with the laser. The set of bias leads is electrically isolated from the set of modulation leads.

28 Claims, 11 Drawing Sheets

MODULAR TRANSISTOR OUTLINE CAN WITH INTERNAL COMPONENTS

CROSS-REFERENCE TO RELATED APPLICATION

This application claims the benefit of U.S. Provisional Application Ser. No. 60/751,880, filed Dec. 20, 2005, entitled "MODULAR TO-CAN WITH INTERNAL COMPONENTS," and incorporated herein in its entirety by this reference.

BACKGROUND OF THE INVENTION

1. Field of the Invention

The present invention relates generally to optical devices with optoelectronic components for data transmission. More particularly, the present invention relates to optical subassemblies that incorporate transistor-outline (TO) cans having various internal components.

2. Related Technology

Recent trends in the advancement of optical data communications have resulted in smaller components and faster data transmission rates. While developers have been successful in producing smaller and faster optoelectronic transmitters, the reliability of smaller transmitters has been problematic. In part, this has resulted from the inherent problems associated with the intricate manufacturing techniques required to produce miniature transmitters that are functionally reliable. Thus, the percentage of inoperable miniature transmitters has increased as the size has decreased.

One consequence of increasing the probability that an optoelectronic transmitter will be inoperable is the drastic increase in manufacturing costs that have to be recouped by the operational transmitters. This is because some optoelectronic transmitters are at an advanced level of production or essentially complete before a functionality test, such as a burn-in, can be performed. As such, an inoperable transmitter may have expensive components installed before a determination can be made as to whether or not it will function as intended. In order for the manufacturer to avoid operating at a loss, the functional optoelectronic transmitters and the optical communication equipment in which they are utilized have to be priced to account for a certain percentage of inoperable devices.

One method of counteracting this problem has been to position certain components of an optoelectronic transmitter remote from the laser assembly, especially in transistor outline can ("TO-can") devices. Briefly, a laser assembly, such as a laser diode, is disposed within the header of a TO-can. Size limitations of the TO-can however have necessitated the positioning of various optical and/or electrical components being external to the header can. This arrangement, in turn, causes other manufacturing difficulties. For example, positioning these components external to the header can cause electronic impedance and/or resistance matching problems that present a concern in view of the narrow margin of error associated with accurately driving the lasers. Also, other problems have arisen from the actual optical path being impeded by adhesives or other bonding materials used to attach optical components to the TO-can.

BRIEF SUMMARY OF EXAMPLE EMBODIMENTS OF THE INVENTION

Generally, embodiments of the present invention are concerned with a TO-can suitable for use in optical subassemblies ("OSA") such as transmitter optical subassemblies ("TOSA") and receiver optical subassemblies ("ROSA"). The TO-can includes a header assembly having a header can coupled to a substrate. The header may include various components.

In one embodiment, a header assembly includes a laser, such as a laser diode, mounted to a substrate. The laser is oriented to be capable of emitting a modulated optical signal along a first beam path that is unaligned with an optical signal axis of the header. In this example, a beam steering device is disposed on the substrate and oriented so as to receive the modulated optical signal from the laser and redirect the received beam along a second beam path that is substantially aligned with the optical signal axis. Optionally, a backreflection inhibitor may be included within the header can and positioned in the path of the modulated optical signal at one of the first beam path or second beam path. The backreflection inhibiter serves to reduce or prevent reflection of emitted signals back to the transmitter. Also, a plurality of electronic leads is in electrical communication with the laser, and with at least one electrical component disposed on the substrate. The plurality of electronic leads includes a first set electrically isolated from a second set. The first set can carry a modulated current to the laser and the second set can carry a bias current to the laser.

In another embodiment, a header includes a header can having a lens. The header can cooperate with the base to define an enclosure within which a substrate is disposed. The substrate has a planar surface oriented substantially orthogonally with respect to an optical signal axis of the header. A laser is disposed on the substrate and emits a modulated beam in a first beam path that is substantially orthogonal with the optical signal axis. An optical turner receives the modulated beam from the laser and redirects the modulated beam to a second beam path that is substantially aligned with the optical signal axis. Optionally, a backreflection inhibitor can be positioned in the path of the modulated optical signal at one of the first beam path or second beam path to limit back reflections toward the laser.

In one configuration, the optical package can include at least six leads that extend into the housing through the header base. These leads can electronically couple with electronic components within the package and/or with the laser. Also, a first set of leads are electrically isolated from a second set of leads. The first set of leads can carry a modulated current to the laser and the second set of leads can carry a biased current to the laser.

In another embodiment, methods of manufacturing a compact optical package is disclosed. In one example, the a method involves assembling a substrate so as to include a laser, other various components and/or circuitry disposed thereon so as to incrementally build a TOSA. A burn-in can be performed on the substrate of an unfinished TOSA in order to test the viability of the substrate and components incorporated on the substrate at various stages of manufacture. That is, the substrate and components can be tested after each component is added, as appropriate, before the TOSA is completed. Alternatively, all components can be mounted to the substrate and then tested. In either case, it can be determined whether or not the substrate and incorporated components survived the burn-in. In the instance the assembly survives the burning, the substrate can be mounted on a header base and the optoelectronic components can be electronically coupled with electronic leads.

These and other aspects of example embodiments of the present invention will become more fully apparent from the following description and appended claims.

BRIEF DESCRIPTION OF THE DRAWINGS

To further clarify the above and other aspects of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS OF THE INVENTION

Figure 1:
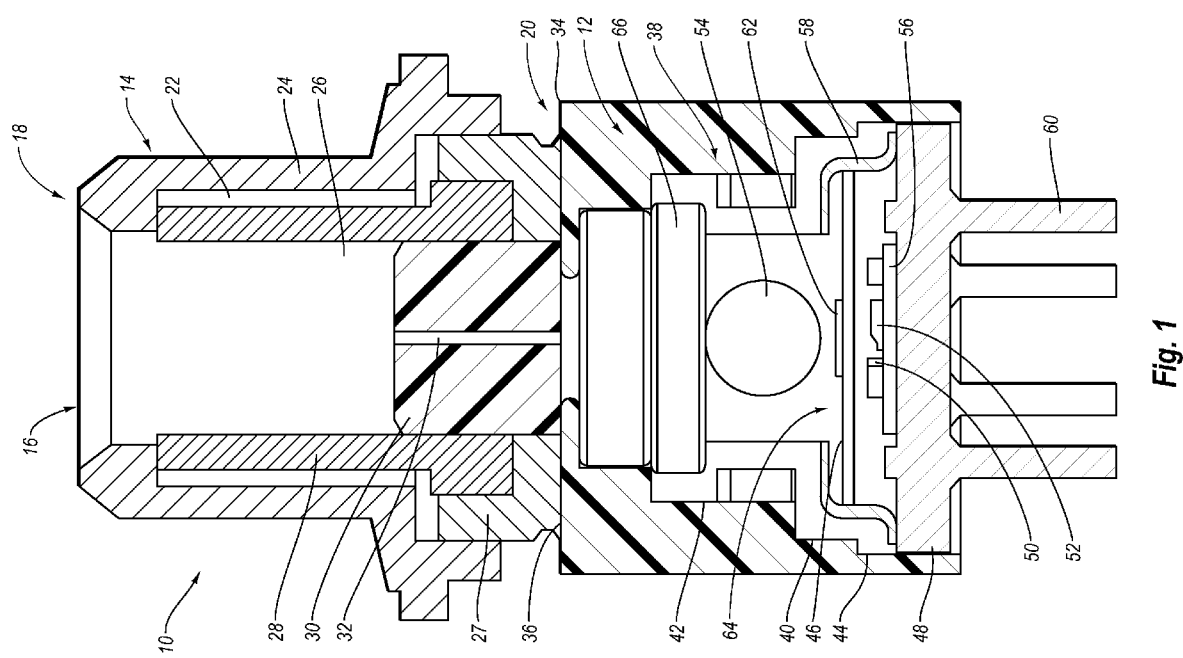
FIG. 1 is a cross-sectional view illustrating an embodiment of a TOSA.

Generally, embodiments of the present invention are directed to optical packages that include header assemblies having various components and suited for use in TO-cans and associated TOSAs.

Additionally, embodiments of the present invention are directed to methods of manufacturing the optoelectronic components and devices, and testing the same at various discrete stages of manufacturing. Thus, the optoelectronic subassemblies, optoelectronic assemblies, and compact optical packages can be tested for reliability and/or functionality as they are being assembled and manufactured so that unreliable or inoperable articles can be discarded or reconfigured relatively early in the manufacturing process before many expensive components are included. Concurrent testing and manufacturing lowers costs of producing functional optoelectronic data communication devices.

I. Optical Subassemblies

Optical communication equipment typically includes an optoelectronic transmitter that converts electrical data into optical data modulated on an optical signal, such as a laser beam. Often, the transmitter assembly is combined with a receiver assembly so as to form a transceiver. However, the transmitters are not required to be combined with a receiver. In any event, the transmitter assemblies are included in a transmitter portion of the optical communication equipment where standardized equipment has predefined size limitations. Accordingly, a transmitter assembly should fit into such predefined size constraints in order to be usable in standardized optical communication equipment. However, it is also desirable for the size, shape, and overall configuration of transmitter assemblies to be modified so that they can be used in other communication equipment if applicable or developed at a later time. Thus, while embodiments of the transmitter assembly are configured to be incorporated into a TO-can, it is feasible and contemplated that such configurations can be adapted to be usable in other forms of transmitters, as well as those that are developed later.

For example, SFF, SFP, XFP, GBIC, and other similar transceiver MSAs define certain overall size limitations as well as transmitter assembly size limitations which, along with the need to improve performance, drives the development of transmitter assemblies with reduced sizes so that they can fit into smaller spaces. In part, reducing the size of one component can allow for the inclusion of additional or more complicated components, as well as larger components, into a module having a predetermined size limitation. That is, a smaller transmitter assembly allows for additional or larger components to fit within a specific type of transceiver. As such, the example transmitter assemblies in accordance with the present invention can be configured to be operable in the foregoing transceivers, and the reduced sizes can also be adapted to fit into smaller spaces as needed.

Embodiments of the invention can be employed in connection with a variety of different protocols and line speeds. Example protocols include, but are not limited to, SONET, Ethernet, and 10 G Ethernet. Example line speeds with which embodiments of the invention are compatible include speeds of 10 Gb/s, or higher.

FIG. 1 is a schematic diagram of an embodiment of an optical sub assembly ("OSA") 10 having an optical package 12 connected to a nose assembly 14. Generally, the nose assembly 14 can include a front end 18 and a back end 20. The nose assembly 14 can include an elongated housing 24 having a longitudinal channel 26 formed therein that opens at the front end 18 as a fiber receptacle 16. The housing 24 is made from a relatively hard material, for example 416 stainless steel. Other hard materials may be used, such as metal or plastic.

The nose assembly 14 is configured to receive a terminal portion of an optical fiber (not shown) in the fiber receptacle 16 at the front end 18. As such, the nose assembly 14 can be configured to retain the fiber by implementing a friction fit, for example. Also, the nose assembly 14 includes a back ring 27 which receives sleeve ring 28. A fiber stop 30, in turn, is received by the back ring 27 and sleeve ring 28. The fiber stop 30 includes an optical channel 32 wherein the fiber is positioned. The optical channel 32 is located along the central axis or other optical axis of the OSA 10. Also, the nose assembly 14 includes a bushing 22 positioned about the sleeve ring 28 and cooperating with the back ring 27 and sleeve ring 28 to receive and hold the optical fiber in the nose assembly 14. In one example, the sleeve ring 28 and fiber stop 30 can be used with the bushings 22 to implement a friction fit suitable to retain the optical fiber (not shown) within the channel 26. Suitable embodiments and methods of manufacturing a nose assembly 14 are discussed in more detail in U.S. patent application Ser. No. 10/832,699, incorporated herein in its entirety by this reference.

The back end 20 of the nose assembly 14 is configured to connect to the optical package 12. The back end 20 can be coupled directly or indirectly to various components or portions of the optical package 12. Significantly, it will be appreciated that the optical package 12 does not have to be any specific shape or be disposed in any particular structure in order to be connected to the nose assembly 14. As such, the optical package 12 can be configured in any fashion that allows the nose assembly 14 to interface with the optical package 12. The nose assembly 14 is coupled to the housing 34 or other appropriate aspect of the optical package 12 by being welded at an interface 36 using laser welding. Other connecting means may be used including, but not limited to, soldering, adhesive, and the like. In addition, simple connecting means eliminate additional components that are required in order to connect header cans to nose assemblies. It will thus be appreciated that the present invention reduces the time and cost of manufacturing of optical subassemblies.

Additionally, the nose assembly 14 can be directly or indirectly attached to a packaging can 38 of optical package 12. As illustrated, the packaging can 38 includes portions having different diameters. That is, the packaging can 38 has a first portion 40 with a larger diameter than a second portion 42, where the first portion 40 is formed contiguously with the second portion 42. In one embodiment, first portion 40 and second portion 42 are formed integrally. In another embodiment, first portion 40 and second portion 42 are formed from discrete parts which are bonded together using suitable bonding means such as, but not limited to, welding, soldering, adhesive, and the like. In addition, an end of the first portion 40 includes a stepped annular lip 44, which has a slightly larger diameter than first portion 40.

In one embodiment, first portion 40, second portion 42, and/or annular lip 44 can each has a substantially circular cross-section. However, first portion 40, second portion 42 and/or annular lip 44 may have any of various cross-sectional shapes such as, but not limited to, oval, polygonal, and the like. In one embodiment, the cross-section of the first portion 40 and/or second portion 42 is selected based on the shape of the component to which the packaging can 38 is connected. Additionally, the packaging can 38 retains a header can 58 that is coupled to a substrate 48.

In one embodiment, packaging can 38 and/or header can 58 is constructed of stainless steel 304L. Stainless steel 304L can be easily processed using know machining processes to form the body of packaging can 38 and/or header can 58, thus allowing packaging can 38 and/or header can 58 to be easily machined into the desired shape. In addition, stainless steel 304L can be laser welded, is non-magnetic, and is corrosion resistant. Furthermore, stainless steel 304L assists in forming hermetic glass solder bonds with window 46 and the header structure 48. However it will be appreciated that packaging can 38 and/or header can 58 may be constructed of any other suitable material(s).

In one embodiment, the window 46 is situated inside the packaging can 38 between the first portion 40 and second portion 42. In another embodiment, the window 46 is disposed within the header can 58 as shown. In still another embodiment, the window is disposed within an aperture 64 in the header can 58. In any event, the window 46 is disposed approximately at the center of the packaging can 38 and/or packaging can 58 to pass optical signals emitted by a laser 50. The laser 50 can comprise any of a variety of different types of lasers including edge emitters, and vertical cavity surface emitting lasers ("VCSEL"). More particular embodiments of the laser include distributed feedback ("DFB") lasers, and Fabry-Perot ("FP") lasers.

In one embodiment, the optical turner 52 is a beam steering device. A beam steering device receives an incident beam that travels along a first optical path, and redirects the beam along a second optical path. Beam steering devices can be beneficial for aligning an optical signal with an optical axis. It will be appreciated that portions 40 and 42 of the packaging can 38 and/or the header can 58 may be resized to be shorter or longer so as to position the window 46 closer or farther away from header structure 48 of optical package 12. For example, placing the laser 50 and/or optical turner 52 close to the window 46 can provide greater flexibility in designing compact, efficient coupling optics between the emitter and external optical fibers.

In one embodiment, the window 46 comprises a piece of ultra flat, thin glass with a thickness of about 0.008 inch, although other materials and geometries may be employed. The window 46 is soldered or otherwise bonded to the inside of packaging can 38, inside of header can 58, and/or within an aperture 64 of the header can 58 to form a hermetic seal. In another example, a Schott glass solder process is used to bond the window 46 to the inside of the packaging can 38, inside of the header can 58, or to the aperture 64 of the header can 58. In one embodiment, the window 46 is coated with an antireflective coating. Alternatively, a backreflection inhibitor 62 may be disposed on or near the window 46.

Additionally, the laser 50 and optical turner 52 are arranged such that optical signals generated by the laser 50 are turned by the optical turner 52 and directed through the window 46 and eventually into an optical fiber (not shown). As such, the laser 50 is disposed upon a substrate 56 with the optical turner 52 in order to enable the optical turner 52 to direct the optical signal from the laser 50 through the window 46. It should be noted here that while example embodiments are concerned with a substrate 56, the scope of the invention is not so limited and substrates comprising various other materials may alternatively be employed. In the illustrated embodiment, the laser 50 and optical turner 52 are disposed on the substrate 56. Because the substrate 56 is positioned orthogonally, or otherwise unaligned, with respect to the longitudinal axis AA of the OSA 10, the laser 50 is positioned off-center and directed at the optical turner 52, which is located approximately at the center axis of the header can 58 in this embodiment. Thus, regardless of the placement and/or orientation of the laser 50, the optical turner 52 can be employed to direct the laser signal into the fiber positioned in the nose assembly 14. It should be noted that, in at least some examples, the longitudinal axis AA of the OSA 10 is substantially coincident with the path followed by an optical signal that is output by the OSA 10.

In one embodiment of the optical package 12, a lens 54, such as a ball lens for example, is disposed in the first portion 40 and/or second portion 42 of packaging can 38. In this example, the lens 54 is held in place by the packaging can 38, header can 58, and/or the aperture 64 in the header can 58. As such, optical signals emitted by the laser 50 and turned by the optical turner 52 pass through the window 46 and then through lens 54. The lens 54 can serve to focus and/or collimate the optical signal generated by the laser 50, and/or implement various other optical effects. While the above embodiments concern device that include a window 46 and/or a lens 54, alternative embodiments of the present invention may employ various other combinations and types of windows and/or lenses, or other optical components.

In the illustrated example embodiment, the optical package 12 further includes an isolator 66, which may be disposed in the second portion 42 or any other suitable portion of the optical package 12. In general, the isolator 66 can be positioned within the packaging can 38 so as to receive the optical signal from the lens 54. Various other isolator locations may be employed however.

With further reference now to the substrate 56, the header structure 48 serves to, among other things, position and retain the substrate 56 in an orientation that is substantially orthogonal with respect to the longitudinal axis AA of the OSA 10. As such, the plane defined by an upper surface of the substrate 56 is substantially orthogonal with longitudinal axis AA. The header structure 48 is configured to mate with a header can 58 so that the substrate 56 is disposed between the header can 58 and the header structure 48. The header can 58 and the header structure 48 together form the housing of, in one example, an optical package 12.

Generally, the laser 50 is in electrical communication with electronic leads 60 that receive electronic signals from a printed circuit board (not shown), thereby causing the laser 50 to convert electrical signals to optical signals that are transmitted from the OSA 10. In this example embodiment, the optical signal emitted by the laser 50 follows a first beam path, that is substantially parallel with the upper surface of the substrate 56, before interacting with the optical turner 52 so as to be redirected along the longitudinal axis AA of the OSA 10. In order to ensure that emitted optical signals are properly launched into the optical fiber, the example active alignment procedures disclosed below may be employed during fabrication of the OSA 10.

According to one embodiment, the header can 58 and header structure 48 are configured so as to facilitate active alignment of the parts. In order to produce an optical device whose components are properly aligned, the header structure 48 is actively aligned relative to the header can 58 prior to attachment of the two parts to each other. However active and/or passive alignment processes may be used in connection with the alignment and positioning of other OSA 10 components as well.

As mentioned above, it is desirable that the header can 58 and/or the header structure 48 be actively aligned before they are sealed or otherwise joined together. Active alignment is beneficial for optical packages having either a window 46 or a lens 54, or both. In general, "active" alignment refers to processes whereby power is transmitted to the optical transmitter component, such as the laser 50, and the resulting optical signal generated by the laser 50 is used to align the laser 50 and/or optical turner 52 with the window 46, lens 54 and/or other components.

In this example embodiment, alignment of the window 46 and/or lens 55 with the optical turner 52 can be important because precise alignment results in efficient coupling of the laser 50 signal into the fiber. In this example, the combination of active alignment of the optical turner 52 with the window 46 and/or lens 54, and the collimating effect of the lens 54 allows the optical signal to be properly launched into an optical fiber attached to the OSA 10.

In one embodiment, the optical turner 52, window 46, lens 54, and/or optical fiber are aligned in a substantially straight line. The straight line may, for example, be substantially coincident with the longitudinal axis AA of the OSA 10, though the foregoing and/or other components may alternatively be arranged along another line. In one case where the signal from the OSA follows a path that is substantially coincident with the longitudinal axis AA, the optical turner 52 is affixed to the substrate 56 and actively aligned with respect to the laser 50 and/or window 46 such that optical signals generated by the laser 50 are emitted through the window 46 without necessitating the use of a waveguide.

In one embodiment, the present invention can allow for optical packages 12 of different sizes to be constructed. According to one particular embodiment of optical package 12, the diameter of the second portion 42 of header can 38 may be smaller than about 0.295 inch. The height of the packaging can 38 and/or header can 58 may be smaller than about 0.225 inch. When the packaging can 38 and/or header can 58 is mated with the header structure 48, the resulting optical package 12 may have a height of approximately 0.265 inch, excluding the leads 60.

In another embodiment, the optical package 12 has substantially the same size as a conventional TO-package. Alternatively, the packaging can 38 and/or header can 58 has substantially the same size as the header can of a conventional TO-can for a laser diode or photo-diode. Thus, the embodiments of optical package 12 may be fitted within optoelectronic transceiver or transmitter modules that are constructed according to standardized form factor requirements.

More particularly, a receiver optical subassembly ("ROSA") or transmitter optical subassembly ("TOSA") including an example embodiment of an optical package can have the following dimensions: width, about 3 cm or less; length, about 6.5 cm or less, and height, about 1.2 cm or less. A GBIC standard requires the dimensions of a module housing to be approximately 3 cm×6.5 cm×1.2 cm. Thus, the OSAs of this example embodiment meet the form factor requirements of the GBIC standard.

In another embodiment, the physical dimensions of an OSA including an example optical package are: width, about 0.54 inch or less; length, about 2.24 inches or less; and height, about 0.105 inch or less. The SFP MSA (i.e., Small Form Factor Pluggable Multisource Agreement) requires the dimensions of a compliant module housing to be approximately 0.54"×2.24"×0.105." Thus, the module can also meet the form factor requirements of the SFP MSA. More generally, embodiments of the invention can be constructed to conform with a variety of MSA and other requirements.

Note that the present invention is not limited to the form factor requirements described above. A person of ordinary skill in the art having the benefit of this disclosure will, appreciate that the present invention is adaptable to various existing or yet to be determined transceiver or transmitter module form factors, some of which can be smaller or larger than those currently practiced.

II. Header Assembly

OSAs in accordance with the present invention can have various configurations and component arrangements. While the following discussion relates to example embodiments of TOSAs that include a TO-can having a laser, such TOSAs can be configured for use with other types of transmitters as well. Thus, the following discussion depicts and describes exemplary embodiments of the present invention that relate to a TO-can having a transmitter.

Figure 2A:
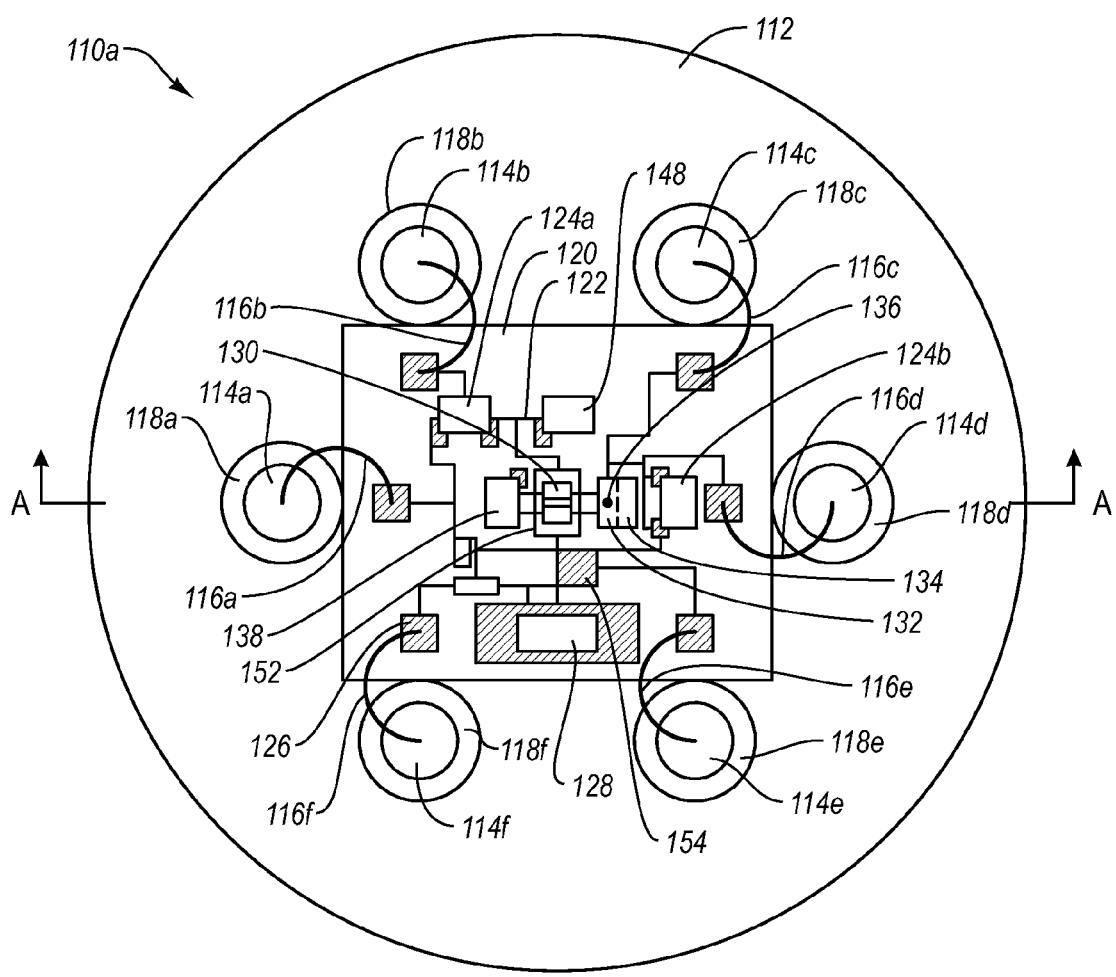
FIG. 2A is a top view illustrating an embodiment of a header assembly for a TO-can.
Figure 2B:
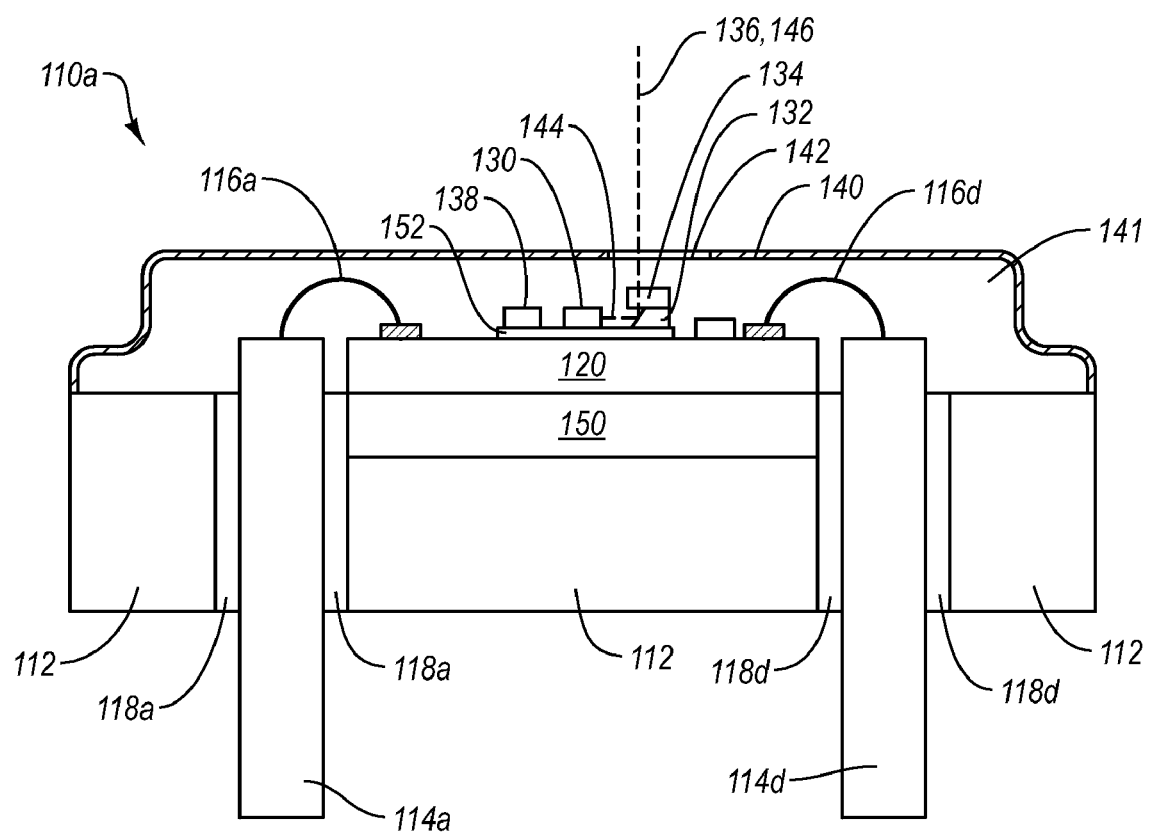
FIG. 2B is a cross-sectional view taken along line A-A of FIG. 1A.

FIGS. 2A-2B are a top view and a cross-sectional side view, respectively, of an embodiment of a header assembly 110a including a header base 112 and a substrate 120, in accordance with the present invention. The header base 112 is configured to attach to a header can 140 in a hermetically sealed arrangement, as shown in FIG. 2B.

In the illustrated embodiment, the header base 112 of the header assembly 110a is generally circular in shape. However, various other shapes can be employed. For example, the header base 112 of the header assembly 110a can have a polygonal, oval, circular, curved, or scalloped configuration, or combinations thereof, and the like.

The header base 112 and/or header can 140 may be constructed from a wide range of materials including plastics, ceramics, and metals. Due to the electromagnetic radiation that may either interfere with the operations of the header assembly 110a or be produced thereby, some embodiments of the header base 112 and/or can 140 include a material, such as a metal, that serves as an EMI barrier. However, the header base 112 and/or can 140 can be constructed from ceramics, polymers and/or other materials as well.

The can 140 includes an optically transmissive window 142 that allows a modulated optical signal to pass therethrough. The window 142 is comprised of any transparent material that does not unduly inhibit or impede the optical signal. Examples of suitable window 142 materials includes glasses, glass-ceramics, plastics, polycarbonates, and other well-known transmissive materials. In some embodiments, the window 142 is substantially circular in shape. However, other shapes may be used. When the can 140 is attached to the header base 112, the window 142 is oriented so as to be substantially orthogonal with an optical signal axis 136 as indicated in the figures. Optionally, the window 142 and optical signal axis 136 are aligned with the center axis of the can 140, or located at an off-center position.

In the illustrated example, the header base 112 includes ports 118a-f, each of which is configured to receive a respective electronic lead 114a-f. The electronic leads 114 are configured to provide electrical signals to the optoelectronic components within the header assembly 110a. Accordingly, one or more of the ports 118 may include a dielectric material, such as a glass, for example, disposed about the lead that extends through that port. Also, in some embodiments where temperature sensitivity is important, it is beneficial for the material in the ports 118 to include a thermally-insulating material or a thermally conducting material. While the ports 118 and corresponding leads 114 are depicted to be uniformly spaced about the header base 112 so that each pair of adjacent leads 114 defines an arc of about 60 degrees, this example arrangement should not be construed in a limiting manner. Rather, such ports 118 and leads 114 can be disposed in any other suitable arrangement. Also, it is possible for the ports 118 to have an inner diameter that is substantially the same size as the outer diameter of the corresponding leads 114. The electronic leads 114 are discussed in more detail below.

A substrate 120, such as a substrate 120, can be disposed on the header base 112. More specifically, the substrate 120 is located proximate to the electronic leads 114a-f so that various optoelectronic and/or electronic components and/or electronic circuits 122 can be electronically coupled to the electronic leads 114. As such, bond wires 116a-f, or other electrical connections, are used to carry the electronic signals from the leads 114a-f to the electronic circuits 122. In one example embodiment, the bond wires 116 are made of gold with diameters of about 2.54 micrometers or less. However, other materials and wire diameters may be employed. The lengths of the bond wires 116 are preferably as short as possible so that they can transmit an electronic signal data at a high rate. The impedance and/or resistance of the bond wires 116 is substantially matched to those of the leads 114 so as to avoid or reduce signal-reflections.

The substrate 120 can include various components such as a laser 130 which, in some embodiments at least, is mounted to the substrate via a submount 152. The laser 130 is electronically coupled to corresponding electronic leads 114 via the circuitry 122. The circuitry 122 is configured to include trace lines and pads to provide the proper connections between and among the electronic leads 114, electronic components, and laser 130. More specifically, the circuitry 122 can include driver circuitry (not shown) configured to drive the laser 130 so that data can be modulated onto the optical signal emitted by the laser 130.

Accordingly, the laser 130 is driven by the electrical current provided by electrically isolated electronic leads 114. As such, the plurality of electronic leads 114 can be divided into different categories with respect to the different electronic signals carried by the different electronic leads 114. By way of example, electrically isolated leads can include a first set of leads 114 carrying a biased electrical current, such as a DC current, and a second set of leads 114 carrying a modulated electrical current, such as an AC current. The biased electrical current provides power to drive components of the electronic circuitry 122, and the modulated electrical current can provide control, or other, signals to the components of the electronic circuitry 122. Also, a third set of leads 114 can be used to carry an electrical current that drives and/or operates optoelectronic components other than the laser 130. In one configuration, six electrical leads 114a-f are used so that each set of leads 114 consists of two leads. However, any number of leads such as eight leads, ten leads, or other numbers of leads can be used to carry control signals and drive the optoelectronic components within the header assembly 110a. In one example, two leads can be used with respect to the biased current 114a-b ("bias leads"), two leads can be used with respect to the modulated current 114e-f ("modulation leads"), and two leads can be used for other components 114c-d ("component leads").

While the leads 114 are depicted to have a round cross-section, any shape can be used. Also, the leads 114 can be comprised of Kovar™, which is a composition that includes iron, nickel, and cobalt, and small quantities (less than 1%) of manganese, silicon, aluminum, magnesium, zirconium, titanium and carbon, other like materials, and/or electronically conducting materials. Any other suitable materials could alternatively be used.

In one embodiment, at least one of the bias leads 114a-b is electronically connected to an inductor 124a-b, such as an 0201 inductor, spiral inductor, or the like. In one embodiment, the inductor 124a-b is placed in-line with the bias leads 114a-b and arranged in serial fashion with respect to the drive circuitry (not shown) that is powering the laser 130. By electronically coupling bias leads 114a-b with inductors 124a-b, the bias leads 114a-b are electronically isolated from the modulation leads 114e-f. That is, the bias leads 114a-b are used to power the laser 130 without interfering with the modulated signal provided by way of the modulation leads 114e-f. Also, it is beneficial in at least some cases to use additional inductors 124a-b to electrically isolate the component leads 114c-d from the modulation leads 114e-f.

Additionally, at least one of the modulation leads 114e-f can be electronically coupled with a matched resistor 126 or series of resistors. As such, the modulated current can be properly provided to the drive circuitry (not shown) with proper impedance and/or resistance matching. In at least some embodiments, the matched resistor 126 or series of resistors is in-line with modulation leads 114e-f and positioned in serial fashion with respect to the drive circuitry.

Also, at least one of the modulation leads 114e-f is electronically connected to a capacitor 128, which can be a tuning capacitor. The capacitor 128 is placed in-line with the modulated lead 114-e-f and positioned before the modulated electronic signal reaches before the drive circuitry (not shown). By electronically coupling a modulated lead 114e-f with a capacitor 128, the bias leads 114a-b and modulation leads 114e-f can be electronically decoupled. This can also electronically isolate the component leads 114c-d from the modulation leads 114e-f.

In any event, the electronically isolated leads are configured for driving a laser and modulating a signal on the optical signal generated by the laser. More generally, the laser 130 can be substituted with any type of optical signal generator that can generate a modulated optical signal for data communications. The laser 130 can be any type of laser configured to be disposed on the substrate 112 with the corresponding size limitations, and generate a modulated optical signal carrying data for use in optical data communications. For example, the laser 130 can be a laser diode such as a Fabry-Perot ("FP"), distributed feedback ("DFB"), VCSEL, or the like. However, other optical signal generators, either known or later developed, which generate a modulated optical signal, can also be employed.

In one embodiment, the laser 130 is disposed on the substrate 120 so as to emit the optical signal along a path that is generally parallel to the upper surface of the substrate. As such, the optical signal is emitted along a first beam path 144 that is generally non-parallel with respect to the optical signal axis 136. The horizontal orientation of the substrate 120 and laser 130 with respect to an axis such as optical signal axis 136 is useful for increasing space within the header space 141 or on the substrate 120 for optoelectronic components. Alternatively, the horizontal orientation of the substrate 120 and laser 130 with respect to an axis such as optical signal axis 136 can allow for the size of the header space 141 to be decreased in the event that additional optoelectronic components are not included in the header space 141.

In general, an optical turner 132 is used to direct an optical signal to a desired location and orientation. In one embodiment, the optical turner 132 is aligned with the first beam path 144 such that the optical turner 132 can direct the optical signal to a second beam path 146. In some instances, the second beam path 146 of the optical signal is substantially coincident with the optical signal axis 136. Among other things then, the optical turner 132 can be employed so that the optical signal from the laser 130 is ultimately directed through the window 142.

Examples of optical turners 132 include mirrors, reflectors, prisms, bent fiber optics, and the like. Some optical turners 132, such as mirrors and some prisms, can be configured and/or oriented with respect to the laser 130 so as to turn an optical signal at nearly any angle. On the other hand, some optical turners 132, such as right angle turners exemplified by turning prisms, redirect an optical signal at about 90 degrees from the incident path. As such, the optical turner 132 is used to align an unaligned optical signal. In the instance the incident beam is orthogonal with the optical signal axis 136, the optical turner 132 can turn the optical signal about 90 degrees from the incident beam path so that the beam is substantially coincident with the optical signal axis 136.

In one example embodiment, the header assembly 110a includes a backreflection inhibitor 134 in communication with the laser 130. Optionally, the backreflection inhibitor 143 can be disposed within the header cavity 141. Alternatively, the backreflection inhibitor 134 can be disposed outside of the header cavity 141, and can be external of the window 142. In general, the backreflection inhibitor 134 decreases the propensity of the emitted optical signal to be reflected back toward the laser 130. This potential problem is addressed by placing the backreflection inhibitor 134 on the substrate 120 in beam path 144 or 146. Alternatively, the backreflection inhibitor 134 can be located external to the header can 140 and within the packaging can 38 (FIG. 1). Backreflection inhibitors 134 include, for example, optical attenuators, ¼ wave plates, and other devices of comparable functionality. Moreover, in some embodiments, the backreflection inhibitor 134 operates as a ¼ wave plate. Embodiments of the orientation of the backreflection inhibitor 134 with respect to the laser 130 and/or optical turner 132 are described in more detail below.

In one embodiment, in order to ensure that the optical signal has enough power and/or is correctly modulated, a monitor 138 is disposed on the substrate 120. More particularly, the monitor 138 is positioned so as to be in optical communication with the laser 130, and oriented so that the monitor 138 acquires at least a portion of the modulated optical signal. The monitor 138 is any type of device that can monitor the functionality of a laser 130, such as a monitor photodiode ("MPD"), for example. In general, the monitor 138 is positioned on the substrate 120 so that it can receive a portion of the optical signal emitted by the laser. In many cases, the nature of the laser 130 is such that a portion of the optical signal generated by the laser is directed toward the monitor 138, in a direction opposite from the optical signal first direction 144.

In one embodiment, the laser 130 is an edge emitter laser that emits optical signals in both the forward direction, such as the first direction 144 and the backward direction. The forward direction refers to the direction in which the optical signals have the strongest intensity, while backward direction refers to the opposite direction. The laser intensity in the backward direction is proportional to the laser intensity in the forward direction. Thus, by measuring the intensity of the signal emitted by the laser 130 in the backward direction, and knowing the relation between the signals emitted in the forward and backward directions, the power of the optical signal in the forward direction can be readily determined.

In some embodiments, the header assembly 110a includes an amplifier 148 within the header cavity 141 on the substrate 120, where the substrate 120 may comprise ceramic and/or other materials. Such amplifiers 148 may include selectable amplifiers, driver chips, and the like. In those cases where the header assembly 110a does not include an amplifier 148, the laser may operate as a short-wave transmitter. On the other hand, the inclusion of an amplifier 148 in the header assembly 110a allows the laser to operate as a long-wave transmitter. Amplifiers of any suitable size, type, and performance can be used and included within the header space 141 and/or disposed on the substrate 120.

The various components, such as the laser 130, monitor 138, and the like can be mounted to the substrate 120 by being directly coupled thereto or indirectly coupled or attached with a submount 152. In some embodiments, the submount 152 is comprised of aluminum nitride or silicon, and can include one or more integrated passive components, such as circuitry, resistors, capacitors, and inductors, to provide improved impedance matching, resistance matching, and signal conditioning.

In one embodiment, the header assembly 110a includes a thermistor 154 and an active thermal control device 150, such as a thermoelectric cooler ("TEC") for example. The thermistor 154, which is operable to measure the temperature of the laser 130 and/or monitor 138, is thermally coupled with the laser 130 and/or monitor 138. This thermal coupling can be accomplished by positioning the thermistor 154 on the substrate 120 at a location that is in relatively close proximity to the laser 130 and/or monitor 138. Temperature measurements from the thermistor 154 are communicated through the circuitry 122, bond wires 116, and leads 114 to a temperature control circuit that may or may not be located outside the optical package 12. The temperature control circuit, in turn, uses the temperature measurement as a basis for adjusting the control signals to the active thermal control device 150. In at least some embodiments, the configuration of the header assembly 110a allows for the temperature control circuitry (not shown) to be disposed within the header space 141 on the substrate 120. In one example, the temperature control circuitry is included in the circuitry 122 on the substrate 120. Depending upon the temperature of the laser 130 and/or monitor 138, the temperature control circuit sends appropriate control signals to the thermal control device 150 in order to control the temperature of the laser 130 and/or monitor 138. With particular reference to the case where a TEC is used, the control signals cause an appropriate amount of electrical power to be directed to the active thermal control device 150, thereby modifying the cooling effect implemented by the active thermal control device.

Figure 2C:
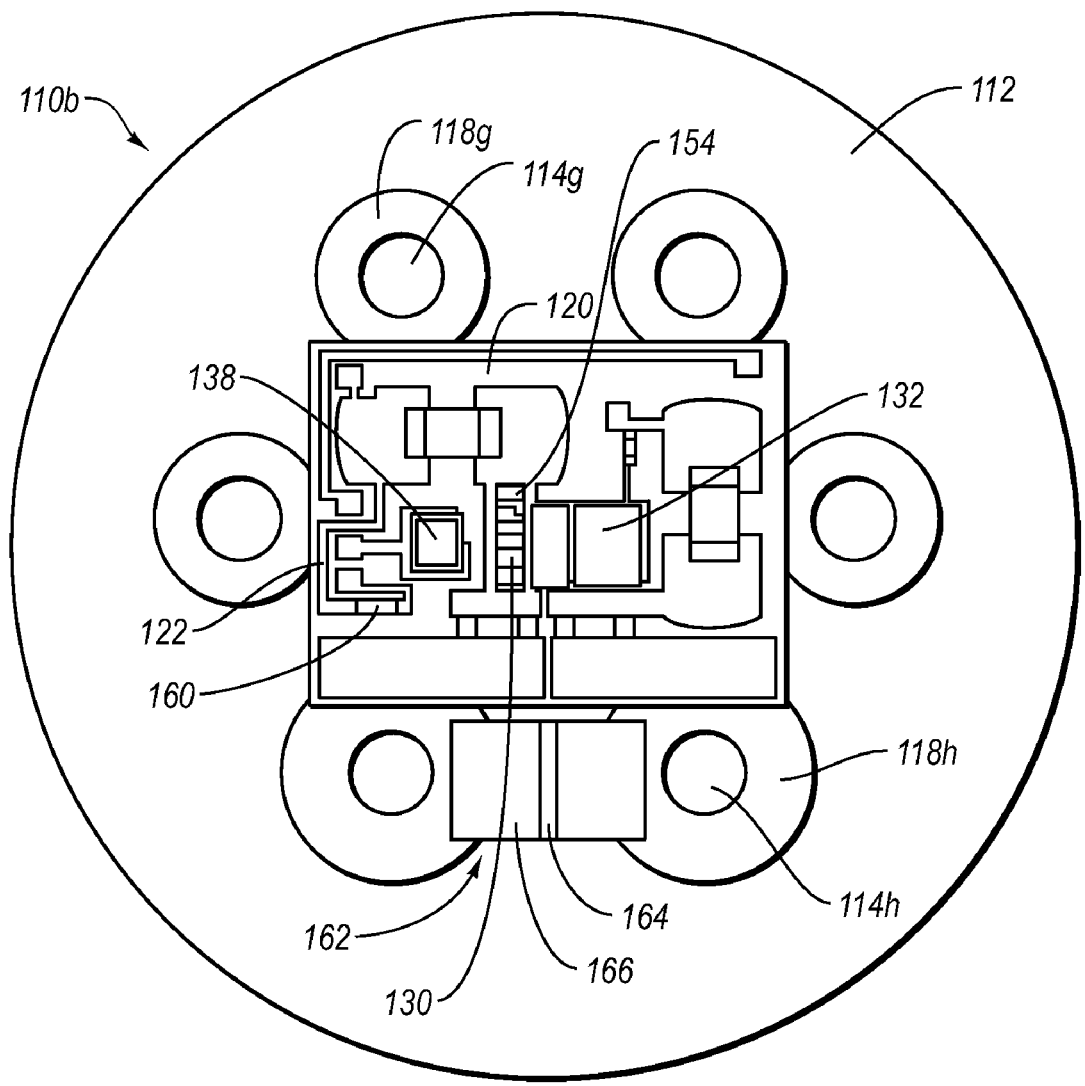
FIGS. 2C-2D are top views illustrating alternative embodiments of header assemblies.

Referring now to FIG. 2C, aspects of another embodiment of a header assembly 110*b* are disclosed. The embodiment of the header assembly 110*b* illustrated in FIG. 2C can include any of the components disclosed in connection with the example embodiments disclosed in FIGS. 2A-2B. Additionally, the header assembly 110*b* includes a heating resistor 160 arranged for thermal communication with one or more components. For example, the heating resistor 160 is useful for maintaining the temperature of the laser 130 and/or monitor 138 when the header assembly 110*b* operates in cold environments or during a warm-up stage. More generally, the heating resistor is one example of a heater such as may be used to affect the temperature of an optical transmitter, such as laser 130 for example. With continuing reference to the it) z as figures, the heating resistor 160 is driven by the circuitry 122, and is controlled in response to signals generated by the thermistor 154. The signals generated by the thermistor 154 correspond with the temperature sensed by the thermistor 154.

Additionally, FIG. 2C illustrates an embodiment of a header assembly 110*b* where the biased lead 114*g* and corresponding port 118*g* are dimensioned differently from the modulation lead 114*h* and corresponding port 118*h*. Particularly, the modulation lead 114*h* and port 118*h* are configured such that their respective dimensions allow for current passed through the lead 114*h* to be properly matched with the circuitry. For example, the dimensions of the modulation lead 114*h* and/or port 118*h* are sized in order to provide for a desired resistance, such as 25 ohms, 50 ohms, or other values.

In one embodiment, the leads 114, such as the modulated lead 114*h*, are electronically coupled to a signal conditioner 162 which processes the electronic signals before those signals enter the circuitry 122. In some embodiments, the signal conditioner 162 comprises a ceramic block 166 that includes a metal strip 164. In some embodiments, the signal conditioner 162 is configured to implement a reduction in inductance associated with the signals received by way of lead 114*h*, but other signal conditioning functionalities and associated circuitry and components may additionally, or alternatively, be implemented.

Figure 2D:
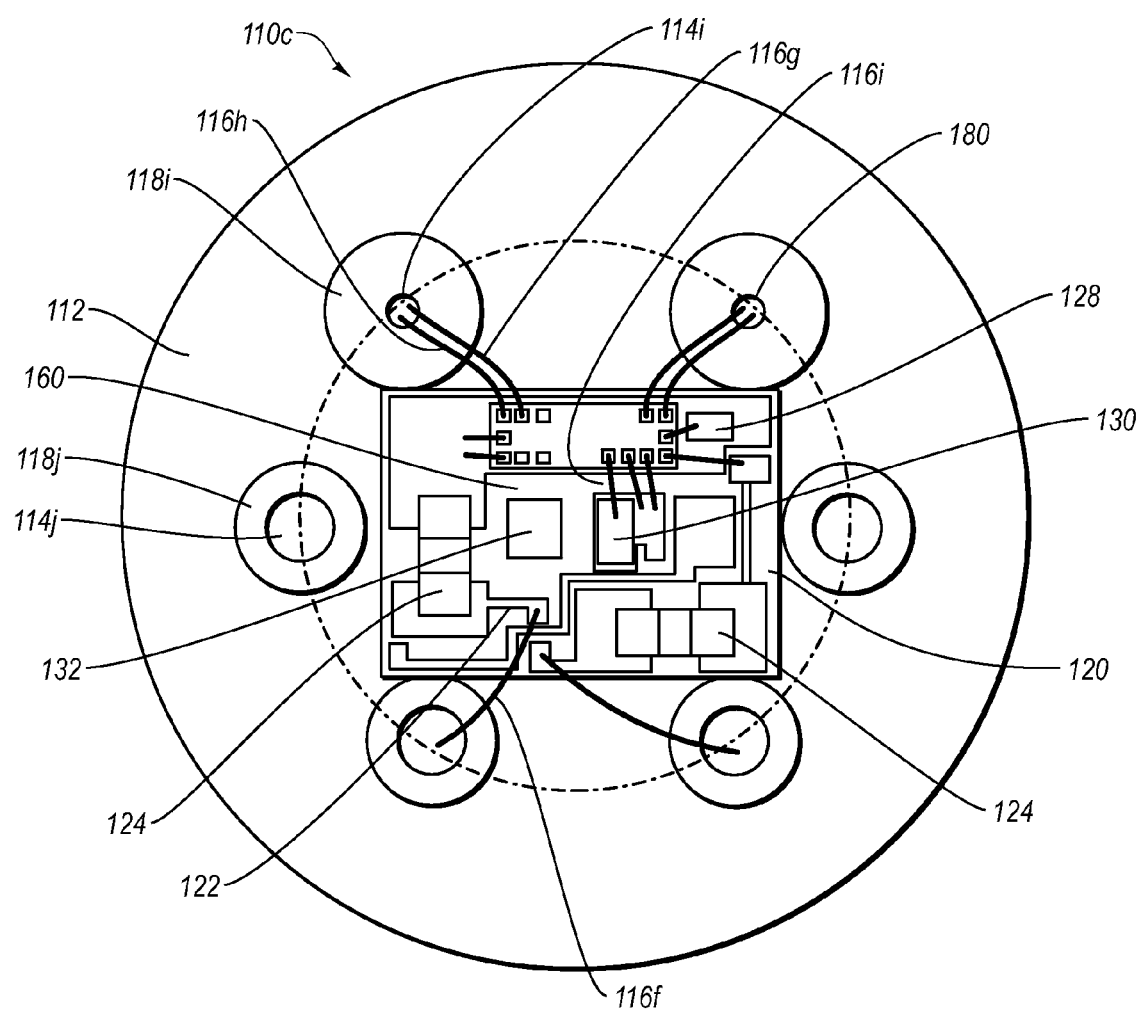

Referring now to FIG. 2D, an exemplary embodiment of a header assembly 110*c* is disclosed. The example header assembly 110*c* can include any of the components depicted and described in connection with the example embodiments disclosed in FIGS. 2A-2C. In the illustrated embodiment, the header assembly 110*c* includes a substrate 112 having a plurality of ports 118. In general, the ports 118 may be spaced at substantially equal intervals about a circle or, as disclosed in FIG. 2D, the arc described by adjacent ports 118 may vary from one set of ports 118 to another, such that the ports 118 are not spaced at substantially equal intervals about a circle. Accordingly, the scope of the invention is not limited to any particular port 118 and/or lead 114 arrangement.

In the illustrated embodiment, ports 118 of various sizes are located adjacent to a substrate 120, where the substrate 120 may comprise ceramic and/or other materials. In this example, port 118*i* has a relatively larger diameter than port 118*j*. Each of the plurality of ports 118 is associated with a corresponding lead 114. As in the case of other example embodiments, the modulation lead 114*i* can have a different diameter and/or other dimensions than the bias lead 114*j*, for example. Moreover, the dimensions of the ports 118 do not necessarily reflect the dimensions of the leads 114. For example, the interior diameter of a particular port 118 may not be the same, or even substantially the same, as the outside diameter of the corresponding lead 114. Various other port and lead dimensions and configurations may also be employed.

In general, the modulation lead 114*i* and/or corresponding ports 118*i* can be configured as necessary to enable transmission of a signal having particular characteristics to the circuitry 122. In one embodiment, the modulation leads 114*i* have a relatively smaller diameter than the bias leads 114*j*, and the ports 118*i* have a relatively larger diameter than the ports 118*j*. In this example, the modulated leads 114*i* and modulated port 118*i* are configured to provide a 50 ohm connection while, in some instances, the modulated lead 114*h* and port 118*h* of FIG. 2C provide a 25 ohm connection. In general then, the characteristics of the signals provided by way of one or more of the leads 114 can be adjusted by way of variations to the geometry of one or more of the leads 114.

With continuing reference to FIG. 2D, the leads 114 are configured for electrical communication with a variety of circuitry, devices and components of the OSA. In the illustrated example, the leads 114 are configured for electrical communication with the circuitry 122 and various other components disposed on the substrate 120. The components may include, among other things, a driver chip 180, capacitors 128, a laser diode 130, inductors 124 such as ferrite beads, and optical turners 132 such as a prism. More generally, the components and circuitry 122 included in the header assembly 110*c* may comprise any components and/or circuitry suitable for implementing desired functionality. The leads 114 communicate with the circuitry 122 via bond wires 116. In some embodiments, one or more leads 114, such as lead 114*i* for example, include more than one bond wire 116*g/h* that are coupled with the circuitry 122. As well, various components on substrate 120 are connected together with bond wires 116*i*.

Figure 2E:
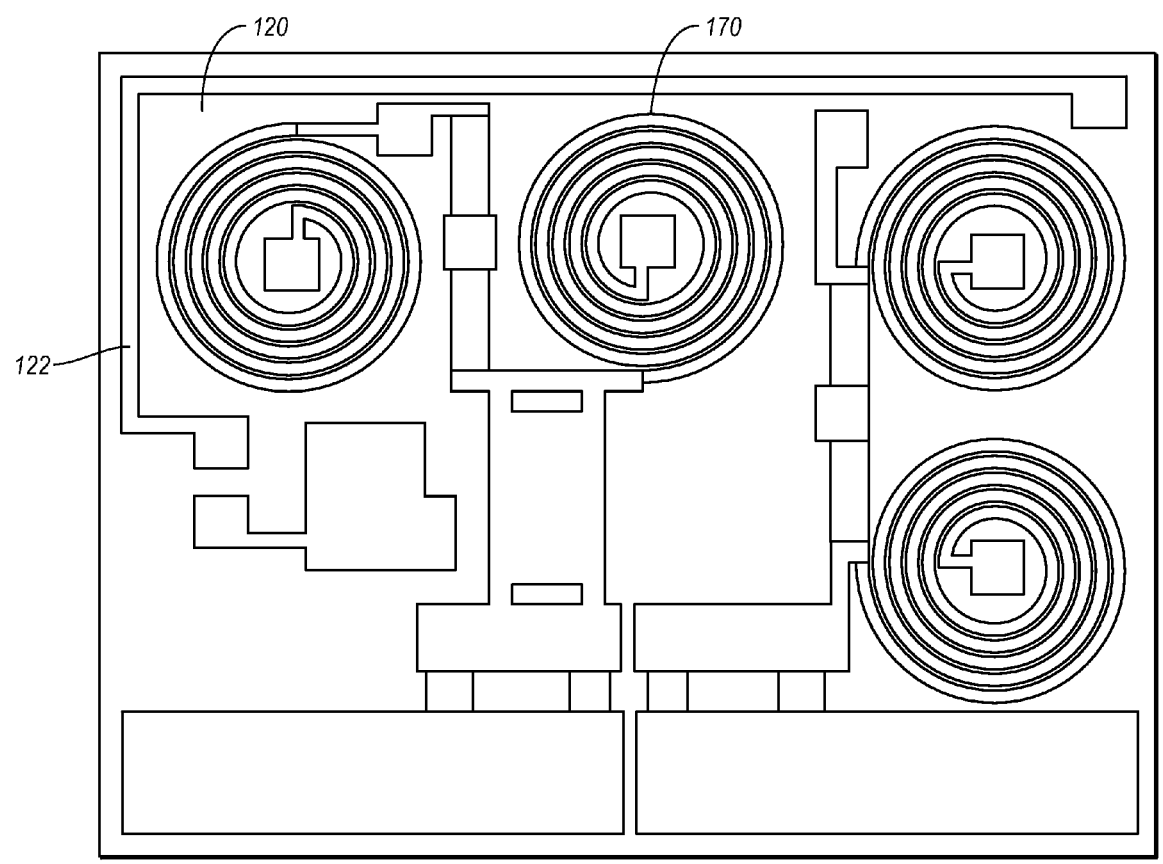
FIG. 2E is a schematic diagram of an embodiment of a substrate for a header assembly.

With attention now to FIG. 2E, details are provided concerning yet other example circuitry 122 that can employed in embodiments of the invention. In this example, the circuitry 122 is disposed on the substrate 120 and includes spiral metal traces 170 that function as inductors. Various other types of inductors may be employed in connection with embodiments of the invention however. Various aspects of the metal traces 170, such as length, width, thickness, geometry, positioning and materials for example, can be varied as necessary to achieve desired inductive effects.

III. Electronic Leads

As disclosed herein, electronic leads and lead arrangements in accordance with the present invention can be implemented in various numbers, configurations, and arrangements with respect to an OSA and associated header assembly. Among other things, embodiments of the invention provide for a relatively high lead density, as many as six or more leads, within a header assembly. In addition, example lead configurations disclosed herein comprise multiple sets of leads, where at least some of the sets are electrically isolated from one or more of the other sets, and where each set of leads is associated with a particular function or group of functions. In this regard, the operational characteristics of one or more of the leads can be varied through the selection of particular lead geometries, materials, and arrangements.

While the following discussion relates to embodiments of electronic circuits and associated electronic leads that are useful in devices such as the OSA 10, the scope of the invention is not so limited and such electronic leads and/or circuitry may be employed in other systems and devices as well.

Figure 3A:
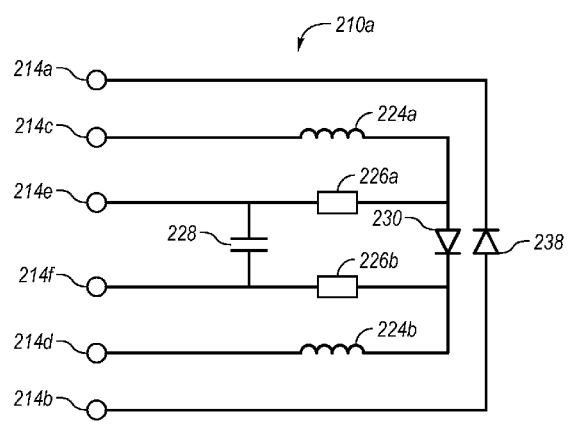
FIGS. 3A-3B are schematic diagrams of embodiments of circuits for driving a laser and operating a monitor.

FIG. 3A is a schematic representation of an example of a circuit 210*a* that includes leads 214*a-f* and various associated components, examples of which are disclosed in connection with FIG. 2B. In general, the circuit 210a includes a first electronic lead 214a that serves as a negative bias pin, and a second electronic lead 214b that serves as a corresponding positive bias pin. In this example embodiment, the first electronic lead 214a and second electronic lead 214b cooperate to provide direct current ("DC") bias signals. Particularly, the first electronic lead 214a and second electronic lead 214b cooperate to drive the monitor 238, which may comprise an MPD, with the DC bias signals.

The illustrated embodiment includes an additional four electronic leads 214c-f that cooperate to drive a laser 230 and modulate the optical signal of the laser 230. Accordingly, the third electronic lead 214c is a positive bias pin, and the fourth electronic lead 214d is a corresponding negative bias pin. The third electronic lead 214c and fourth electronic lead 214d cooperate to provide DC bias signals to power the laser 230. The fifth electronic lead 214e is a first modulation signal pin, and the sixth electronic lead 214f is a corresponding second modulation signal pin. The fifth and sixth electronic leads 214e and 214f cooperate to provide a modulation data signal to the laser 230 that the laser 230 then uses to generate a modulated optical signal.

With more specific reference now to the example embodiment of FIG. 3A, the circuit 210a includes various electronic components in communication with the leads 214a-f. In this example, six different leads are employed to provide electrical connectivity. As disclosed elsewhere herein, this relatively high lead, or pin, density of the associated header enables a relatively high level of functionality to be implemented within the header.

As disclosed in FIG. 3A, the example circuit 210a includes various components for facilitating the bias and modulation functionalities. More particularly, the example circuit 210a includes the following: an inductor 224a in line between the third electronic lead 214c and the laser 230; an inductor 224b in line between the fourth electronic lead 214d and the laser 230; a matching resistor 226a in line between the fifth electronic lead 214e and the laser 230; a matching resistor 226b in line between the sixth electronic lead 214f and the laser 230; and a capacitor 228 between the fifth electronic lead 214e and the sixth electronic lead 214f.

Figure 3B:
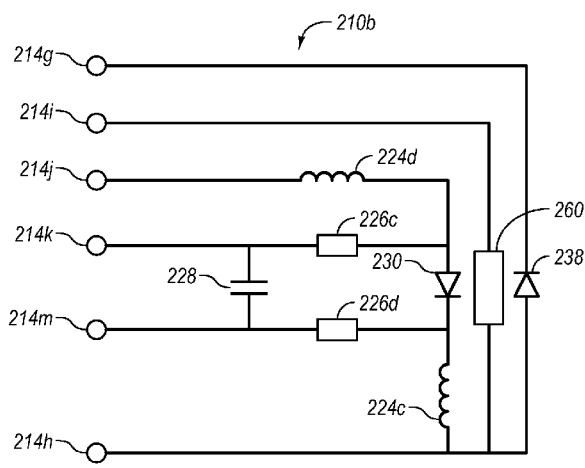

Aspects of an alternative electronic circuit 210b are disclosed in FIG. 3B. Among other things, the circuit 210b includes electrical connections between the leads 214 and various header assembly components, examples of which are disclosed in FIG. 2B. Particularly, the example circuit 210b includes a first electronic lead 214g that is a negative bias pin, and a second electronic lead 214h that is a ground pin and functions as a corresponding positive bias for the first electronic lead 214g. In this example, the first electronic lead 214g and second electronic lead 214h cooperate to provide DC bias signals to the laser 230. The first electronic lead 214g and second electronic lead 214h cooperate to drive the monitor 238, such as an MPD for example, with DC bias signals. Additionally, a third electronic lead 214i is also a positive bias pin that is in electrical communication with the second electronic lead 214h, which serves as a corresponding negative bias pin. Thus, the first electronic lead 214g and third electronic lead 214i are both in electrical communication with the second electronic lead 214h, which functions as a ground. As in some other example embodiments, a heating resistor 260 is connected across leads 214i and 214h to facilitate control of the temperature, and thus the performance, of the laser 230.

With continuing reference to the example embodiment of FIG. 3B, three additional electronic leads 214j, k, and m are provided that cooperate to drive and modulate the laser 230.

In this example, the fourth electronic lead 214j is a positive bias pin, and the corresponding negative bias pin is the second electronic lead 214h. As a result of this arrangement, the second electronic lead 214h is the corresponding bias pin for the following: a positive bias pin for the first electronic lead 214g, which is the negative bias pin for the monitor 238; a negative bias pin for the third electronic lead 214i, which is the positive bias pin for the heating resistor 260; and, a negative bias pin for the fourth electronic lead 214j, which is the positive bias pin for the laser 230. This example configuration allows the fifth electronic lead 214k to serve as a first modulation signal pin, and the sixth electronic lead 214m to serve as a corresponding second modulation signal pin. Thus, the fifth electronic lead 214k and the sixth electronic lead 214m cooperate to provide a modulation data signal to the laser 230 that the laser 230 uses to generate a modulated optical signal.

As disclosed in FIG. 3B, the example circuit 210b includes various electronic components for implementing the bias, modulation and other functionalities. Accordingly, the circuit 210b includes the following: an inductor 224c in line between the second electronic lead 214h and the laser 230; an inductor 224d in line between the fourth electronic lead 214j and the laser 230; a matching resistor 226c in line between the fifth electronic lead 214k and the laser 230; a matching resistor 226d in line between the sixth electronic lead 214m and the laser 230; and a capacitor 228 across the fifth electronic lead 214k and the sixth electronic lead 214m.

While various embodiments of electronic leads and lead configurations have been disclosed, other embodiments of electronic lead configurations can be employed within the scope of the present invention. Additionally, the disclosed embodiments of electronic lead configurations can be modified to include other components or arrangements of components. Thus, the scope of the invention is not limited to the disclosed examples.

IV. Header Substrate

The substrate of the OSA header assembly can be implemented in a variety of different ways. Aspects of some example implementations of substrates 120 have been disclosed elsewhere herein in connection with the discussion of FIGS. 2a-2d for example. The following discussion is generally concerned with further aspects of various example embodiments of a substrate suitable for use in a header assembly.

Among other things, the example substrate configurations disclosed herein allow for the use of relatively short bond wires because, in some embodiments at least, the substrate is shaped to correspond with the shape of the electronic leads. That is, the substrate can include portions that fit tightly, or are generally adjacent to, or disposed proximately with, the leads so that the bond wires have a minimal length. Also, in some configurations, the edge of the substrate can include contact pads that electronically couple with the electronic leads, and thereby reduce or eliminate the need for the use of bond wires. Shaping of the substrate provides additional space that can be used for accommodating additional components on the substrate and within the header cavity. As well, shaping of the header may also enable more efficient use of header space. While aspects of example embodiments of headers are disclosed in more detail below, scope of the present invention is not limited to the examples disclosed herein.

Figure 4A:
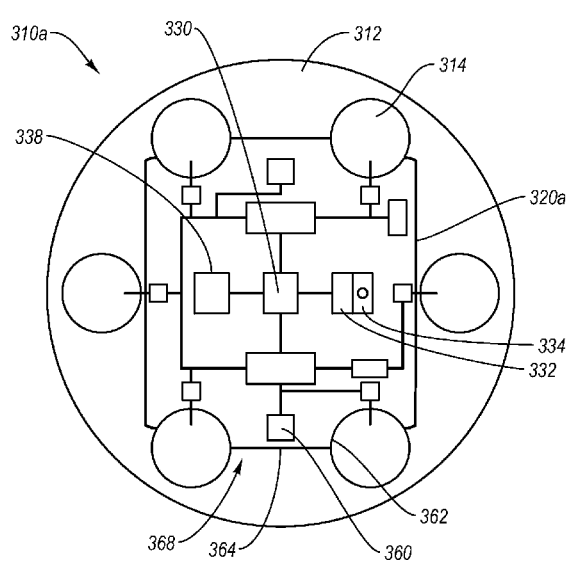
FIGS. 4A-4C are top views of example embodiments of a header assembly incorporating various types of substrates.
Figure 4B:
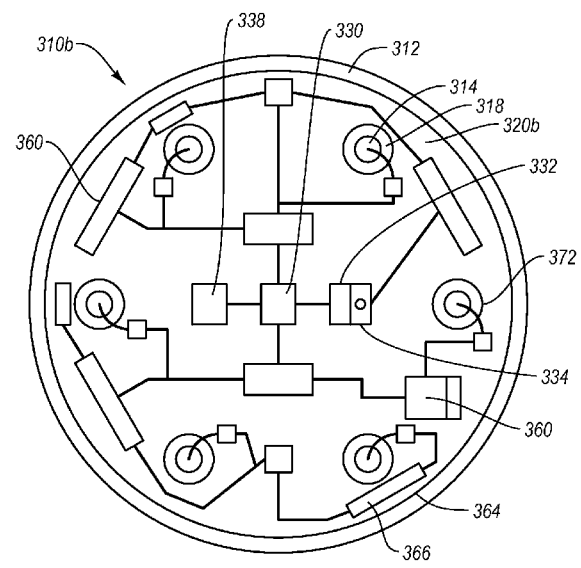
Figure 4C:
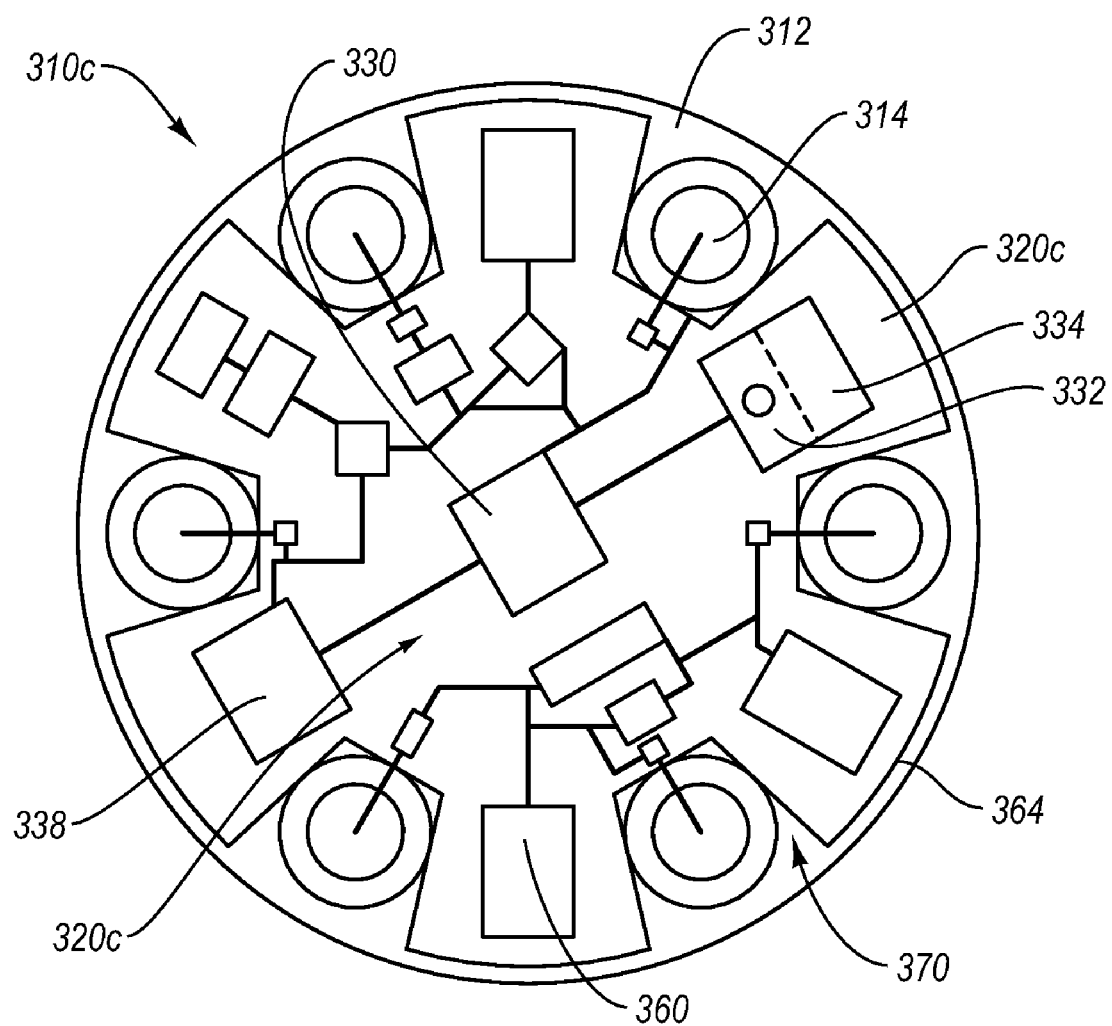

FIGS. 4A-4C are top views illustrating different example header assemblies 310a-c, respectively, that include substrates of various configurations. The illustrated embodiments of header assemblies 310 have substrates that are illustrated as 320a-c, respectively. It should be noted that the disclosed substrates 320 are examples only and the scope of the invention is not limited to the disclosed examples. Moreover, one or more features of the various substrates can be combined with one or more other features of another substrate to produce yet further substrate configurations.

In these example embodiments, the substrate 320, which may comprise ceramic and/or other materials, is disposed on a header base 312. Various components can be mounted to the substrate 320 including, but not limited to, a laser 330 or other optical emitter, optical turner 332, backreflection inhibitor 334, monitor 338, and/or other optoelectronic components, examples of which are disclosed elsewhere herein.

Referring specifically to FIG. 4A, an embodiment of a header assembly 310a includes a substrate 320a that defines a plurality of cutouts 362 that, in at least some embodiments, each define a substantially circular arc. In the illustrated embodiment, the cutouts are disposed along the edge 364, and are each shaped so as to substantially conform to the shape of a corresponding electronic lead 314. As a result of this configuration and arrangement, the cutouts allow for the substrate 320a to include extended portions 368 that extend between the leads 314. As such, the substrate 320a can include one or more components 360 on the extended portions 368. Thus, the extended portions 368 can provide additional usable space within the header assembly 310a. Although it is illustrated as having sufficient curved features 362 to conform with four leads 314, in other configurations, the substrate 320a can include any number of cutouts having any desired geometry. In one example embodiment, the substrate 320a includes six cutouts 362, each of which corresponds with an associated lead 314. More generally however, aspects such as the number, size, geometry, position and orientation of the one or more of the cutouts 362 may be varied as necessary.

FIG. 4B discloses aspects of an alternative embodiment of a header assembly 310b that includes a substrate 320b. In the illustrated example, the substrate 320b includes ports 318 that extend through the substrate 320b and are configured and arranged to receive a corresponding electronic lead 314. It should be noted that as contemplated herein, the ports 318 comprise one example of a cutout. The inclusion of ports 318 in the substrate 320b allows for a significant portion, if not all, of the cross-sectional area of the substrate 320b to be used for the placement of components and circuitry. The efficient use of substrate 320b space results from the fact that components 360 can not only be disposed between different leads 314, but can also be placed between the leads 314 and the edge 364 of the substrate 320b. For example, components 366, which may comprise any OSA component(s), are located in this fashion. Among other things then, the ported substrate 320b allows for efficient use of space in the header assembly 310b.

FIG. 4C discloses aspects of an alternative embodiment of a header assembly 310c that includes a substrate 320c. The substrate 320c includes one or more cutouts 370 shaped to include one or more substantially straight edges and corners. However, the cutouts 370 can include one or more curved edges as well. In any event, the substrate 320c also allows for peripheral components 360 to be located along the edge 364 and/or in between the leads 314. This configuration also allows for additional components to be disposed within the packaging rather than having to be externally located. Aspects such as the size, number, orientation, location and geometry of the cutouts 370 can be varied.

While various embodiments of substrates have been disclosed herein, the scope of the invention is not limited to the disclosed example embodiments. Additionally, the disclosed example substrate embodiments are not constrained for use with any particular components and systems.

V. Active Temperature Control Device

As disclosed elsewhere herein, at least some embodiments of the invention include thermal control device that is used to regulate the temperature of various components, such as the laser for example, that are positioned in the optical package 12 (see FIG. 1). In at least some embodiments, a thermal control device, which may be embodied as an active thermal control device such as a TEC for example, is located within the header assembly of a TO-can. In one aspect, the space saved by the configuration of the optoelectronic components on the substrate can be used by the thermal control device. In any event, various types of thermal control devices can be used.

Figures 5A, 5B:
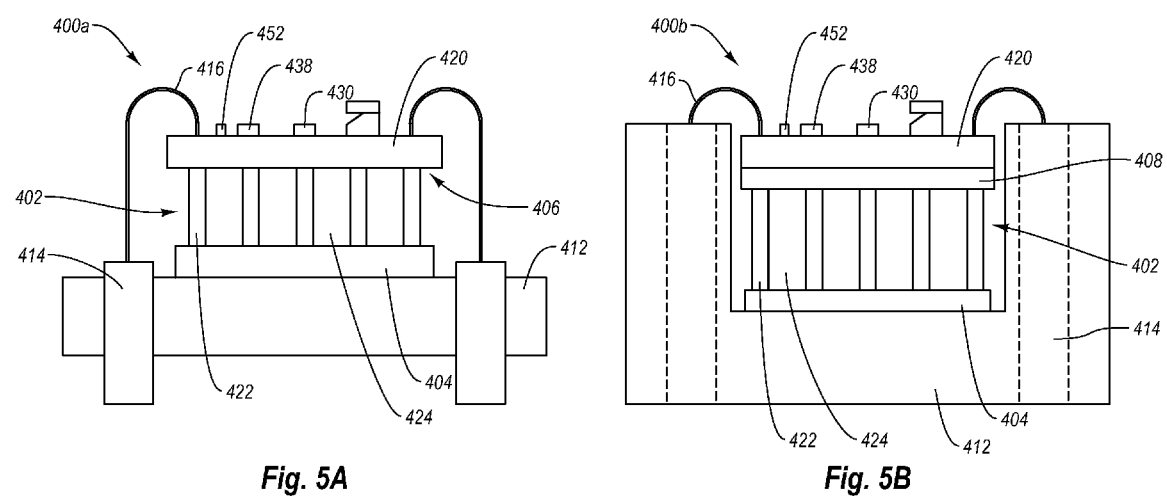
FIGS. 5A-5B are side views illustrating aspects of embodiments of OSAs that include a thermal control device.

Attention now turns to FIGS. 5A-5B, which are side views that disclose various aspects of example embodiments of a portion of a TOSA 400 that includes a thermal control device, TEC 402 in this example. The TEC 402 can be any active thermal control device suitable for regulating the temperature of one or more of the components, such as the optoelectronic components for example, of the TOSA 400. As depicted, the TEC 402 includes a bottom portion 404, as well as a top portion 406 that is in thermal communication with the substrate 420. In at least some embodiments, the top portion takes the form of a separate cap 408 (as depicted in FIG. 5B) on the TEC 402, and the bottom portion 404 takes the form of a TEC base 404 (as depicted in FIGS. 3A-3B). In at least some embodiments, the TEC 402 is disposed between the substrate 420 and the header base 412.

In the illustrated example, the TEC 402 includes a plurality of thermoelectric elements 422 disposed between the TEC base 404 and the top portion 406. Also, the top portion can include a cap 408 as shown in FIG. 5B. While a few thermoelectric elements 422 are illustrated, any number can be used. Also, the size and shape of the thermoelectric elements 422 can be varied. In general, the thermoelectric elements 422 serve to transfer heat from the top portion 406 or cap 408, as applicable, to the TEC base 404, or vice versa, depending on the direction of electric current that is provided to these thermoelectric elements 422. More particularly, the thermoelectric elements 422 are electronically coupled to temperature control circuitry (not shown) so that operation of the TEC 402 can be controlled. The electronic leads 414 facilitate transmission of control signals and power to the TEC 402.

According to one embodiment, the laser 430 and monitor 438 are mounted on the substrate 420, and are additionally in thermal communication with the TEC 402. Thus, temperature related fluctuations in the light intensity measured by the monitor 438, and/or temperature induced fluctuations in the optical signals generated by the laser 430 are substantially controlled by using the TEC 402 to control the temperature of the optoelectronic components on the substrate 420.

In one embodiment, the top portion 406 or cap 408, as applicable, and/or the TEC base 404 are passive heat sinks made of a material, such as ceramic for example, that can include beryllium oxide (BeO) and materials with similar characteristics. In some cases, the thermoelectric elements 422 include Bismuth Telluride ($Bi_2Te_3$) and other materials. In the example illustrated embodiment, the thermoelectric elements 422 are separated by one or more spacers 424 that include one or more of a gas, thermally conducting material, thermally insulating material, electrically conducting material, or electrically insulating material. In one embodiment, the spacer 424 defines a space that is substantially evacuated.

In one embodiment, operation of the TEC 402 is controlled by signals provided by a thermistor 452. In the illustrated example, the thermistor 452, which is operable to measure the temperature of the laser 430, is mounted to the substrate 420 or the active TEC 402. More generally however, the thermistor 452 is in thermal communication with the laser 430. Temperature measurements from the thermistor 452 are communicated through bond wires 416 and leads 414 to an external control circuit (not shown), which in turn adjusts the control signals to the TEC 402 based on the received temperature measurements. Specifically, depending on the temperature of the laser 430, the control circuit sends appropriate control signals to drive an appropriate amount of electric current through the active TEC 402 so as to control the direction and amount of heat flow with respect to the laser 430. Examples of control circuits that may be used in connection with the control of laser temperature are disclosed in United States Pre-grant Publication No. 2003/0152390, entitled "Control Circuit for Opto-Electronic Module With Integrated Temperature Control," which is incorporated by reference. Also, one possible alternative embodiment of active thermal control device is disclosed in U.S. Pat. No. 6,868,104, entitled "Compact header assembly With Integrated Temperature Control," which is incorporated herein in its entirety by this reference.

VI. Optical Backreflection Inhibitors

As stated, some OSA configurations employ backreflection inhibitors, such as optical attenuators and ¼ wave plates, for example, disposed outside of the window of the TO-can. The backreflection inhibitors can vary in size and shape, and many often are a film. At least some embodiments of the invention are configured such that the backreflection inhibitor is disposed within the header cavity. While the backreflection inhibitor can be disposed outside of the header space or on the window in a manner that does not interfere with the integrity of the optical signal, placement of the backreflection inhibitor within the header cavity can avoid the need for epoxies and/or adhesives that would interfere with the optical signal generated by the laser.

FIGS. 6A-6D are side views illustrating various configurations 500 that include a backreflection inhibitor, referred to collectively herein at 534, arranged to receive an optical signal. In these examples, the backreflection inhibitor 534 is positioned within the header can, although the scope of the invention is not limited to such an arrangement.

The backreflection inhibitor 534 disclosed in the examples of FIG. 6A to 6D is one example of a backreflection inhibitor 534 that may be employed in connection with embodiments of the invention, and various other sizes, shapes and/or orientations of a backreflection inhibitor may also be employed. For example, the backreflection inhibitor 534 is positioned in some instances in path 544 so as to receive the optical signal from the laser 530 prior to receipt of the optical signal by the optical turner 532. In other instances, the backreflection inhibitor 534 is positioned in path 546 so as to receive the optical signal from the optical turner 532 after the optical turner 532 has received the optical signal from the laser 530.

Figure 6A:
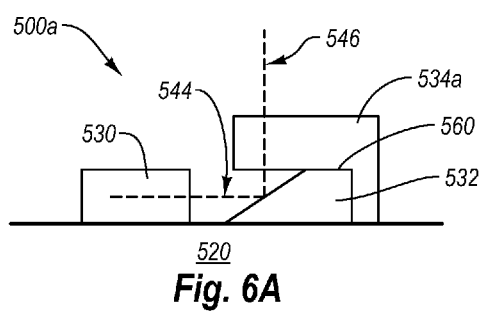
FIGS. 6A-6F are side views illustrating embodiments of optical component orientations usable in an OSA.

FIG. 6A illustrates an example configuration 500*a* where the backreflection inhibitor 534*a* is disposed on the optical turner 532. More specifically, the backreflection inhibitor 534*a* is disposed on a top surface 560 of the optical turner 532 so that the optical signal in the path 546 passes through the backreflection inhibitor 534*a*. In this example configuration, the backreflection inhibitor 534*a* is shaped so as to allow the backreflection inhibitor 534*a* to be bonded by an adhesive or epoxy to the substrate 520. In one alternative arrangement, the window (not shown) is positioned on top of, but not bonded to, the backreflection inhibitor 534*a*. In yet another example, the outer edges of the backreflection inhibitor 534*a* and optical turner 532 are coupled so that no adhesive or epoxy is in the optical path. In a further arrangement, the backreflection inhibitor 534*a* is film coupled with the top surface 560.

Figure 6B:
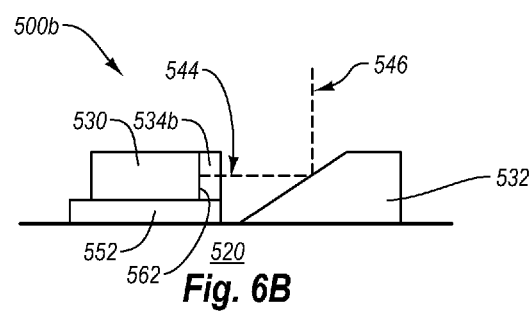

FIG. 6B illustrates a configuration 500*b* where the backreflection inhibitor 534*b* is attached to the emitting surface 562 of the laser 530. In another example embodiment, the backreflection inhibitor 534*b* is positioned proximate to, but not in contact with, the emitting surface 562.

In either case, the backreflection inhibitor 534*b* is disposed so that the optical signal from the laser 530 passes along the path 544 through the backreflection inhibitor 534*b*. In this example, the backreflection inhibitor 534*b* may be any size or configuration that permits such positioning. In one alternative arrangement, the laser 530 and/or backreflection inhibitor 534*b* are coupled to the substrate via a submount 552. This configuration 500*b* allows for the backreflection inhibitor 534*b* to be bonded by an adhesive or epoxy to the substrate 520 and/or submount 552, thereby avoiding the need for placement of adhesive and epoxy in the path 544.

Figure 6C:
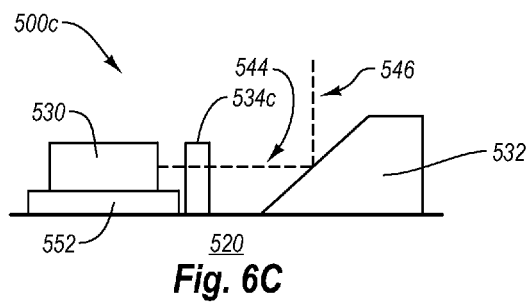

FIG. 6C illustrates a configuration 500*c* where the backreflection inhibitor 534*c* is disposed between the laser 530 and the optical turner 532. More specifically, the backreflection inhibitor 534*c* is coupled with the substrate 520, so that the optical signal in the path 544 passes through the backreflection inhibitor 534*c*.

Figure 6D:
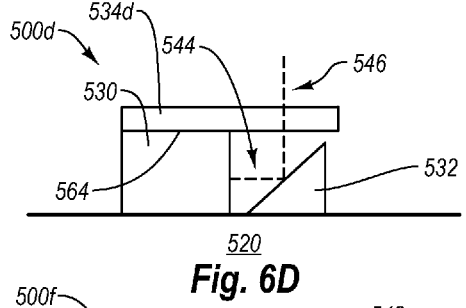

FIG. 6D illustrates a configuration 500*d* where the backreflection inhibitor 534*d* is coupled to the top surface 564 of the laser 530. In this example embodiment, the backreflection inhibitor 534*d* is configured and arranged to extend into the path 546 so that the optical signal in the path 546 passes through the backreflection inhibitor 534*d*.

Figure 6E:
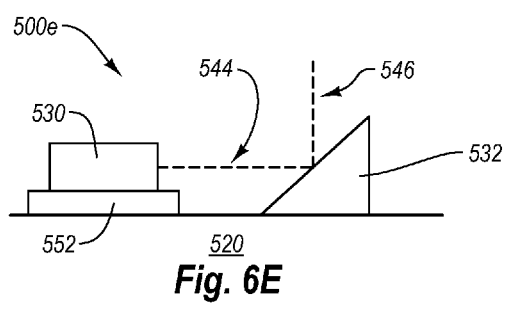
Figure 6F:
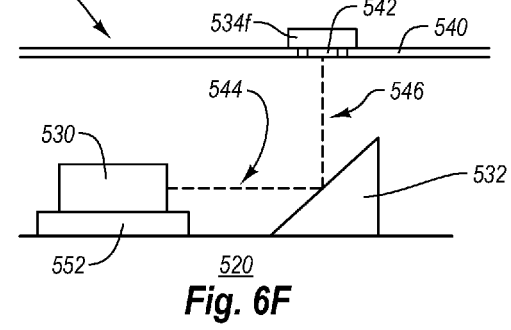

FIG. 6E illustrates an example of a configuration 500*e* that does not employ a backreflection inhibitor. In a variation of the example embodiments of FIGS. 6A through 6E, FIG. 6F illustrates a configuration where the backreflection inhibitor 534*f* is disposed outside of the header can 540, such as on the window 542 for example. The backreflection inhibitor 534*f* may alternatively be located in other areas outside the header can 540.

While various configurations 500*a*-*f* have been illustrated to show backreflection inhibitor 534 being disposed within the TO-can, other similar configurations can be used. Thus, the respective configurations, and/or arrangement, of optical turner 532 and/or backreflection inhibitor 534 can be modified as desired to suit a particular application.

VII. Modules

As disclosed elsewhere herein, embodiments of the invention can be employed in a variety of environments. Example environments include modules such as optoelectronic transceivers. Such transceivers can be constructed to conform with various standards such as the Multi-Source Agreements (MSA) for SFF, SFP, or XFP for example. Of course, various other standards and agreements may be used to guide the construction of modules. As noted elsewhere herein, the modules may be configured to operate at various line speeds, or groups of line speeds including, but not limited to, 1/2/4 Gb/s and 10 Gb/s, or higher. Accordingly, the scope of the invention is not limited to modules of any particular form factor, line speed, or protocol.

In one example embodiment, an optoelectronic module includes a housing within which a printed circuit board is at least partially disposed within the housing. One or more optical subassemblies are also at least partially disposed within the housing and are in electrical communication with circuitry of the printed circuit board. In this example, at least one of the optical subassemblies includes a substrate having a first surface that is substantially orthogonal with respect to a longitudinal axis of the optical subassembly. A laser is supported by the first surface of the substrate and is arranged such that optical signal emitted by the laser travels along a path that is substantially orthogonal to the longitudinal axis. Finally, an optical turner is also included that is supported by the first surface of the substrate and oriented so as to receive the optical signal from the laser along the first path. As well, the beam steering device is configured such that the optical signal is output from the beam steering device along a second path that is substantially coincident with the longitudinal axis.

Of course, the foregoing is but one example of a module. It should be noted that various other modules can incorporate a variety of different combinations of the components, devices and circuitry disclosed herein. Accordingly, the scope of the invention is not limited to any particular module embodiment.

VIII. Manufacturing and Testing

In connection with embodiments of the invention, various manufacturing methods can be employed. In one example, a method of manufacturing an optical package includes assembling a substrate that includes various electronic and/or optoelectronic components. Examples of such components include, but are not limited to: (a) a laser; (b) monitor; (c) electronic circuitry; (d) drive circuitry; (e) an inductor; (f) a matched resistor; (g) amplifier; and/or (h) a tuning capacitor. After any of the foregoing components, combination thereof, or other components are installed on the substrate, such components can be tested by a burn-in process where the components are subjected to various operating and environmental conditions.

That is, the components of the OSA or other device can be tested at various stages of assembly so that defects which would result in device failures can be identified at as early a stage in manufacture as possible. In one embodiment of a manufacturing method, the laser undergoes a burn-in after being installed directly or indirectly via a submount on the substrate. Installation of the laser and subsequent burn-in can also include the laser being coupled with the circuitry or other electronic components, such as the resistors, inductors, tuning capacitors, and the like. In some examples, the laser and corresponding circuitry undergo a burn-in after the laser is installed on the substrate. In another example, a burn-in is performed after the monitor is installed on the substrate. In this example, burn-in is performed after the monitor is coupled with circuitry and electronic components. In at least some cases, the burn-in is performed after both the laser and the monitor have been installed.

In one embodiment, a burn-in is performed after the amplifier or driver chip is installed on the substrate. More generally however, the burn-in can be performed at any point during installation of the components on the substrate. Also, burn-in can be performed after installation of components on the substrate is completed but before the substrate is attached to a base and/or thermal control device. In this way, the substantially complete substrate can undergo a burn-in and the results of the burn-in can be analyzed before the substrate is attached to the base and/or disposed within the header assembly of the TO-can.

As the foregoing suggests, a burn-in may be performed at any of a variety of different stages of manufacturing the OSA. For example, a burn-in process can be performed at the following junctures: (a) after circuitry is installed on the substrate; (b) after a laser is installed on the substrate; (c) after the laser is electronically coupled to the circuitry; (d) after the laser is electronically coupled to the drive circuitry; (e) after the circuitry is electronically coupled to a resistor and/or an inductor; (f) after the circuitry is electronically coupled to a tuning capacitor; (g) after a thermal control device is coupled to the substrate; (h) after a monitor is disposed adjacent to the laser; (i) after the monitor is coupled to the circuitry; (j) after a turning prism is disposed on the substrate so as to be optically coupled with the optical signal in a first direction; (k) after a backreflection inhibitor is positioned in optical communication with the optical signal in one of the first or second directions; and/or (l) after the amplifier or driver chip is coupled to the circuitry. Also, burn-ins can be performed at more than one stage.

At the conclusion of any burn-in, the involved component(s) and/or circuitry may then be analyzed to facilitate a determination as to whether or not those components and/or circuitry survived the burn-in. Also, a determination can be made as to whether or not an additional or longer burn-in may be needed. In any event, after a burn-in is completed, the surviving components and/or circuitry can then be further processed, while components and/or circuitry that did not survive the burn-in can be discarded or reconfigured.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical package, the optical package comprising:
   a substrate;
   a laser supported by the substrate and configured for electrical communication with circuitry disposed on the substrate, and the laser being arranged to emit an optical signal along a first path;
   a beam steering device supported by the substrate and arranged so as to receive the optical signal from the laser along the first path, and the beam steering device being configured such that the optical signal is output from the beam steering device along a second path; and
   a plurality of electronic leads in communication with the circuitry on the substrate, the plurality of electronic leads including a plurality of modulation leads and a plurality of bias leads in electrical communication with the laser,
   wherein the plurality of bias leads is electrically isolated from the plurality of modulation leads.

2. The optical package as recited in claim 1, wherein the optical package is configured to be implemented in a TO-can.

3. The optical package as recited in claim 1, wherein the beam steering device comprises a turning prism.

4. The optical package as recited in claim 1, wherein the first path is substantially orthogonal with respect to the second path.

5. The optical package as recited in claim 1, wherein a first one of the plurality of electronic leads is dimensioned differently than a second one of the plurality of electronic leads.

6. The optical package as recited in claim 1, further comprising a backreflection inhibitor positioned in the path of the modulated optical signal so that the optical signal in the first beam path or second beam path passes through the backreflection inhibitor.

7. The optical package as recited in claim 6, wherein at least a portion of the backreflection inhibitor is secured to at least one of the laser and the beam steering device with an adhesive such that the path of the modulated optical signal does not pass through the adhesive.

8. The optical package as recited in claim 6, wherein the backreflection inhibitor comprises a ¼ wave plate.

9. The optical package as recited in claim 1, further comprising at least one other component supported by the substrate, the at least one other component comprising one or more of a monitor photodiode; an amplifier; driver chip; heating resistor; thermal control device; thermistor; monitor; matching resistor; inductor; capacitor; and, ferrite beads.

10. The optical package as recited in claim 9, wherein the plurality of electronic leads further comprises a set of leads configured and arranged to provide electrical current to the at least one other component.

11. The optical package as recited in claim 10, wherein the set of leads that is configured and arranged to provide electrical current to the at least one other component comprises at least two leads.

12. The optical package as recited in claim 1, wherein the plurality of electronic leads comprises six electronic leads.

13. The optical package as recited in claim 1, wherein at least one of the modulation leads is in electrical communication with at least one of a matched-resistor; and, a tuning capacitor.

14. The optical package as recited in claim 1, wherein at least one of the bias leads is in electrical communication with one of the following components such that a bias current associated with the bias leads is electrically isolated from a modulation current associated with the modulation leads: an inductor; and, at least one ferrite bead.

15. The optical package as recited in claim 1, wherein the plurality of electronic leads includes at least one ground lead that is in electrical communication with one of the following components: an inductor; and, at least one ferrite bead.

16. The optical package as recited in claim 1, wherein the substrate defines a plurality of cutouts, each of the leads being at least partially received within a corresponding cutout.

17. An optical package, comprising:
a substrate having a first surface that is substantially orthogonal with respect to a longitudinal axis of the optical package;
a laser supported by the first surface of the substrate, the laser being arranged such that optical signal emitted by the laser travels along a path that is substantially orthogonal to the longitudinal axis;
a beam steering device supported by the first surface of the substrate and oriented so as to receive the optical signal from the laser along the first path, and the beam steering device being configured such that the optical signal is output from the beam steering device along a second path that is substantially coincident with the longitudinal axis of the optical package; and
at least six electronic leads,
wherein at least two of the electronic leads are arranged for electrical communication with an electronic component within the package and at least four of the electronic leads are arranged for electrical communication with the laser.

18. The optical package as recited in claim 17, wherein the at least four electronic leads arranged for electrical communication with the laser include:
a set of modulation leads in electrical communication with the laser; and
a set of bias leads in electrical communication with the laser, the set of bias leads being electrically isolated from the set of modulation leads.

19. The optical package as recited in claim 17, wherein the substrate defines a plurality of cutouts, each of which is configured to at least partially receive a corresponding electronic lead.

20. The optical package as recited in claim 17, wherein the laser comprises one of: a Fabry-Perot (FP) laser; or, a distributed feedback (DFB) laser.

21. The optical package as recited in claim 17, further comprising a backreflection inhibitor positioned in one of: the first path; or, the second path.

22. The optical package as recited in claim 21, wherein the backreflection inhibitor comprises a ¼ wave plate.

23. The optical package as recited in claim 17, wherein the optical turner comprises a turning prism.

24. The optical package as recited in claim 17, further comprising a thermal control device in thermal communication with the laser.

25. An optoelectronic module, comprising:
a housing;
a printed circuit board at least partially disposed within the housing;
at least one optical subassembly at least partially disposed within the housing and being in electrical communication with circuitry of the printed circuit board, the at least one optical subassembly comprising:
a substrate having a first surface that is substantially orthogonal with respect to a longitudinal axis of the optical subassembly;
a laser supported by the first surface of the substrate, the laser being arranged such that optical signal emitted by the laser travels along a path that is substantially orthogonal to the longitudinal axis;
a beam steering device supported by the first surface of the substrate and oriented so as to receive the optical signal from the laser along the first path, and the beam steering device being configured such that the optical signal is output from the beam steering device along a second path that is substantially coincident with the longitudinal axis;
at least one other component supported by the first surface of the substrate; and
a plurality of leads comprising:
a set of modulation leads in electrical communication with the laser;
a first set of bias leads in electrical communication with the laser and being electrically isolated from the set of modulation leads; and
a second set of bias leads in electrical communication with the at least one other component,
wherein a first one of the plurality of leads is dimensioned differently than a second one of the plurality of leads.

26. The optoelectronic module as recited in claim 25, wherein the optoelectronic transceiver substantially complies with one of the following Multi-Source Agreements (MSA): SFF; SFP; or XFP.

27. The optoelectronic module as recited in claim 25, further comprising a receiver optical subassembly (ROSA) in electrical communication with circuitry of the printed circuit board.

28. The optoelectronic module as recited in claim 25, wherein the optoelectronic transceiver is compatible for operation with line speeds of at least about 10 Gb/s.

* * * * *

UNITED STATES PATENT AND TRADEMARK OFFICE
CERTIFICATE OF CORRECTION

| | | |
|---|---|---|
| PATENT NO. | : 7,492,798 B2 | Page 1 of 3 |
| APPLICATION NO. | : 11/456848 | |
| DATED | : February 17, 2009 | |
| INVENTOR(S) | : Deng et al. | |

It is certified that error appears in the above-identified patent and that said Letters Patent is hereby corrected as shown below:

Column 2
Line 18, change "inhibiter" to --inhibitor--
Line 49, change "is" to --are--
Line 49, after "the" remove [a]

Column 3
Line 17, change "FIG. 1A" to --FIG. 1--

Column 4
Line 33, unbold "416"
Line 50, change "bushings 22" to --bushing 22--

Column 5
Line 23, change "has" to --have--
Line 31, change "substrate 48" to --header structure 48--
Line 33, unbold both instances of "304L"
Line 34, change "know" to --known--
Line 39, unbold "304L"
Line 40, unbold "304L"
Line 48, change "window" to --window 46--

Column 6
Line 49, change "device" to --devices--

Column 7
Line 37, change "lens 55" to --lens 54--
Line 50, change "OSA" to --OSA 10--

Signed and Sealed this
Twenty-second Day of February, 2011

David J. Kappos
*Director of the United States Patent and Trademark Office*

CERTIFICATE OF CORRECTION (continued)
U.S. Pat. No. 7,492,798 B2

Column 9
Line 1, change "includes" to --include--
Line 31, remove the first instance of "120"

Column 10
Line 63, change "substrate 112" to --substrate 120--

Column 11
Line 44, change "143" to --134--
Line 44, change "header cavity 141" to --header space 141--
Line 46, change "header cavity 141" to --header space 141--

Column 12
Line 8, change "first direction 144" to --first beam path 144--
Line 13, change "while backward" to --while the backward--
Line 22, change "header cavity 141" to --header space 141--

Column 13
Line 15, change "heating resistor" to --heating resistor 160--
Lines 17-18, change "the it) z as figures" to --the figures--
Line 50, change "ports 118" to --ports 118$i$-$j$--

Column 14
Line 36, change "can employed" to --can be employed--

Column 15
Line 27, change "arc" to --are--
Line 45, change "leads 214" to --leads 214$g$-$m$--

Column 16
Line 42, change "FIGS, 2*a*-2*d*" to --FIGS. 2A-2D--
Line 61, change "scope" to --the scope--

Column 17
Line 41, change "cutout" to --cutout 372--

Column 18
Line 6, change "include thermal" to --include a thermal--
Line 26, change "top portion" to --top portion 406--
Line 35, change "top portion" to --top portion 406--

Column 19
Line 21, change "of active" to --of an active--

CERTIFICATE OF CORRECTION (continued)
U.S. Pat. No. 7,492,798 B2

Column 21
Line 8, change "that optical" to --that an optical--
Line 31, change "combination" to --combinations--
Line 36, change "device" to --devices--

Column 23
Line 10, change "more of" to --more of:--
Line 25, change "one of" to --one of:--
Line 44, change "that optical signal" to --that an optical signal--

Column 24
Line 30, change "that optical signal" to --that an optical signal--
Line 60, change "with circuitry" to --with the circuitry--